United States Patent
Tran et al.

(10) Patent No.: US 10,446,246 B2
(45) Date of Patent: Oct. 15, 2019

(54) METHOD AND APPARATUS FOR DATA REFRESH FOR ANALOG NON-VOLATILE MEMORY IN DEEP LEARNING NEURAL NETWORK

(71) Applicant: Silicon Storage Technology, Inc., San Jose, CA (US)

(72) Inventors: Hieu Van Tran, San Jose, CA (US); Vipin Tiwari, Dublin, CA (US); Nhan Do, Saratoga, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/990,220

(22) Filed: May 25, 2018

(65) Prior Publication Data
US 2019/0287631 A1    Sep. 19, 2019

Related U.S. Application Data

(60) Provisional application No. 62/642,867, filed on Mar. 14, 2018.

(51) Int. Cl.
| | | |
|---|---|---|
| G11C 16/26 | (2006.01) | |
| G11C 16/34 | (2006.01) | |
| G11C 16/04 | (2006.01) | |
| G06N 3/08 | (2006.01) | |
| G11C 16/30 | (2006.01) | |

(52) U.S. Cl.
CPC .......... *G11C 16/3431* (2013.01); *G06N 3/08* (2013.01); *G11C 16/0425* (2013.01); *G11C 16/26* (2013.01); *G11C 16/30* (2013.01)

(58) Field of Classification Search
None
See application file for complete search history.

(56) References Cited

U.S. PATENT DOCUMENTS

| | | | | |
|---|---|---|---|---|
| 7,551,503 | B2* | 6/2009 | Ho ..................... | G11C 16/3418 365/189.07 |
| 7,558,149 | B2* | 7/2009 | Chen ..................... | B82Y 10/00 365/185.21 |
| 8,194,487 | B2* | 6/2012 | Carman ................ | G11C 11/406 365/177 |
| 2002/0145916 | A1* | 10/2002 | Chevallier ......... | G11C 16/3418 365/185.33 |
| 2002/0191440 | A1* | 12/2002 | Chevallier ......... | G11C 16/3418 365/185.09 |
| 2007/0279996 | A1* | 12/2007 | Rolandi ............. | G11C 16/3418 365/185.22 |
| 2008/0084743 | A1* | 4/2008 | Grant ..................... | G11C 5/025 365/185.08 |
| 2012/0166897 | A1* | 6/2012 | Franca-Neto ...... | G11C 16/3495 714/721 |
| 2019/0164595 | A1* | 5/2019 | Kim .................. | G11C 11/40603 |

* cited by examiner

*Primary Examiner* — Tan T. Nguyen
(74) *Attorney, Agent, or Firm* — DLA Piper LLP US

(57) ABSTRACT

Numerous embodiments of a data refresh method and apparatus for use with a vector-by-matrix multiplication (VMM) array in an artificial neural network are disclosed. Various embodiments of a data drift detector suitable for detecting data drift in flash memory cells within the VMM array are disclosed.

22 Claims, 27 Drawing Sheets

FIGURE 10

| | WL | WL-unsel | BL | BL-unsel | SL | SL-unsel |
|---|---|---|---|---|---|---|
| Read | 1-3.5V | -0.5V/0V | 0.6-2V (Ineuron) | 0.6V-2V/0V | 0V | 0V |
| Erase | ~5-13V | 0V | 0V | 0V | 0V | 0V |
| Program | 1-2V | -0.5V/0V | 0.1-3 uA | Vinh ~2.5V | 4-10V | 0-1V/FLT |

FIGURE 12

| | WL | WL-unsel | BL | BL-unsel | SL | SL-unsel |
|---|---|---|---|---|---|---|
| Read | 1-3.5V | -0.5V/0V | 0.6-2V | 0.6V-2V/0V | ~1V (Ineuron) | 0V |
| Erase | ~5-13V | 0V | 0V | 0V | 0V | SL-inhibit (~4-8V) |
| Program | 1-2V | -0.5V/0V | 0.1-3 uA | Vinh ~2.5V | 4-10V | 0-1V/FLT |

FIGURE 14

| | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2V | -0.5V/ 0V | 0.6-2V (Ineuron) | 0V | 0-2.6V | 0-2.6V | 0-2.6V | 0-2.6V | 0-2.6V | 0V | 0V |
| Erase | 0V | 0V | 0V | 0V | 0V | 0-2.6V | 0-2.6V | 5-12V | 0-2.6V | 0V | 0V |
| Program | 0.7-1V | -0.5V/ 0V | 0.1-1uA | Vinh (1-2V) | 4-11V | 0-2.6V | 0-2.6V | 4.5-5V | 0-2.6V | 4.5-5V | 0-1V |

FIGURE 16

|  | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2V | -0.5V/0V | 0.6-2V (Ineuron) | 0V | 0-2.6V | 0-2.6V | 0-2.6V | 0-2.6V | 0-2.6V | 0V | 0V |
| Erase | 0V | 0V | 0V | 0V | 0V | CGINH (4-9V) | 0-2.6V | 5-12V | 0-2.6V | 0V | 0V |
| Program | 0.7-1V | -0.5V/0V | 0.1-1uA | Vinh (1-2V) | 4-11V | 0-2.6V | 0-2.6V | 4.5-5V | 0-2.6V | 4.5-5V | 0-1V |

METHOD AND APPARATUS FOR DATA REFRESH FOR ANALOG NON-VOLATILE MEMORY IN DEEP LEARNING NEURAL NETWORK

PRIORITY CLAIM

This application claims priority to U.S. Provisional Patent Application No. 62/642,867, filed on Mar. 14, 2018, and titled "Method and Apparatus for Data Refresh for Analog Neuromorphic Memory in Artificial Neural Network," which is incorporated by reference herein.

FIELD OF THE INVENTION

Numerous embodiments of a data refresh method and apparatus for use with flash memory cells in a vector-by-matrix multiplication (VMM) array in an artificial neural network are disclosed.

BACKGROUND OF THE INVENTION

Artificial neural networks mimic biological neural networks (the central nervous systems of animals, in particular the brain) which are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows, and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. patent application Ser. No. 15/594,439, which is incorporated by reference. The non-volatile memory arrays operate as analog neuromorphic memory. The neural network device includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs.

Each non-volatile memory cells used in the analog neuromorphic memory system must be erased and programmed to hold a very specific and precise amount of charge in the floating gate. For example, each floating gate must hold one of N different values, where N is the number of different weights that can be indicated by each cell. Examples of N include 16, 32, and 64.

Conventional flash memory device do not need to have their data refreshed, because each flash memory cell can hold its value (which typically is limited to two possible levels or sometimes four possible levels, i.e., N=2 or 4) indefinitely. However, in the flash memory cells used in VNMs, because N is significantly larger, the probability of data becoming incorrect (i.e., corrupted) over time increases due to data drift that naturally occurs over time based on changes in temperature and process variations.

What is needed is a mechanism for detecting data drift in a flash memory cell in a VNM and to refresh the data in the cell to its original, desired state.

SUMMARY OF THE INVENTION

Numerous embodiments of a data refresh method and apparatus for use with flash memory cells in a vector-by-matrix multiplication (VMM) array in an artificial neural network are disclosed.

BRIEF DESCRIPTION OF THE DRAWINGS

FIG. 10 depicts operating voltages for the vector multiplier matrix of FIG. 9.

FIG. 12 depicts operating voltages for the vector multiplier matrix of FIG. 11.

FIG. 14 depicts operating voltages for the vector multiplier matrix of FIG. 13.

FIG. 16 depicts operating voltages for the vector multiplier matrix of FIG. 15.

DETAILED DESCRIPTION OF THE INVENTION

The artificial neural networks of the present invention utilize a combination of CMOS technology and non-volatile memory arrays.

Non-Volatile Memory Cells

Figure 1:
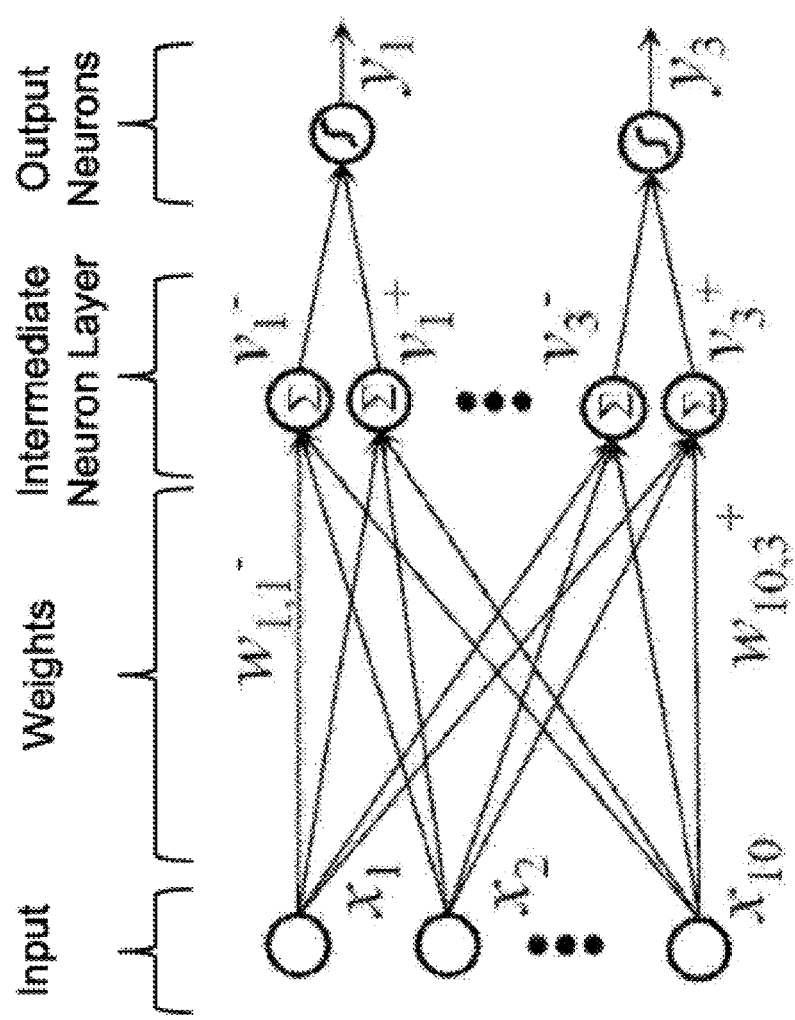
FIG. 1 is a diagram that illustrates an artificial neural network.
Figure 2:
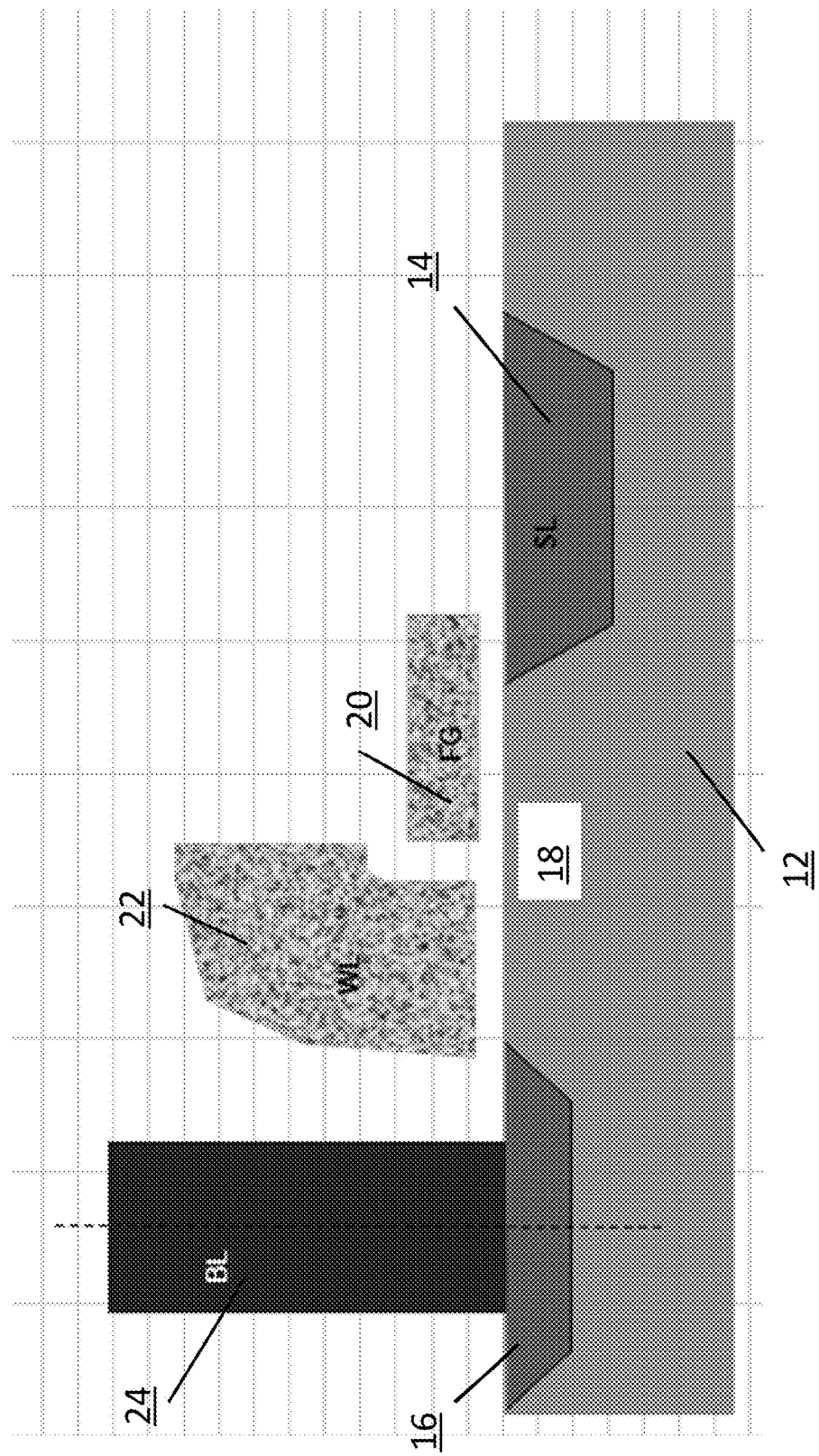
FIG. 2 is a cross-sectional side view of a conventional 2-gate non-volatile memory cell.

Digital non-volatile memories are well known. For example, U.S. Pat. No. 5,029,130 ("the '130 patent") discloses an array of split gate non-volatile memory cells, and is incorporated herein by reference for all purposes. Such a memory cell is shown in FIG. 2. Each memory cell 210 includes source region 14 and drain region 16 formed in a semiconductor substrate 12, with a channel region 18 there between. A floating gate 20 is formed over and insulated from (and controls the conductivity of) a first portion of the channel region 18, and over a portion of the source region 16. A word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source 16. Electron current will flow from the source 16 towards the drain 14. The electrons will accelerate and become heated when they reach the gap between the word line terminal 22 and the floating gate 20. Some of the heated electrons will be injected through the gate oxide 26 onto the floating gate 20 due to the attractive electrostatic force from the floating gate 20.

Memory cell 210 is read by placing positive read voltages on the drain 14 and word line terminal 22 (which turns on the channel region under the word line terminal). If the floating gate 20 is positively charged (i.e. erased of electrons and positively coupled to the drain 16), then the portion of the channel region under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage ranges that can be applied to the terminals of memory cell 210 for performing read, erase, and program operations:

TABLE No. 1

Operation of Flash Memory Cell 210 of FIG. 2

|  | WL | BL | SL |
|---|---|---|---|
| Read | 2-3 V | 0.6-2 V | 0 V |
| Erase | ~11-13 V | 0 V | 0 V |
| Program | 1-2 V | 1-3 µA | 9-10 V |

Figure 3:
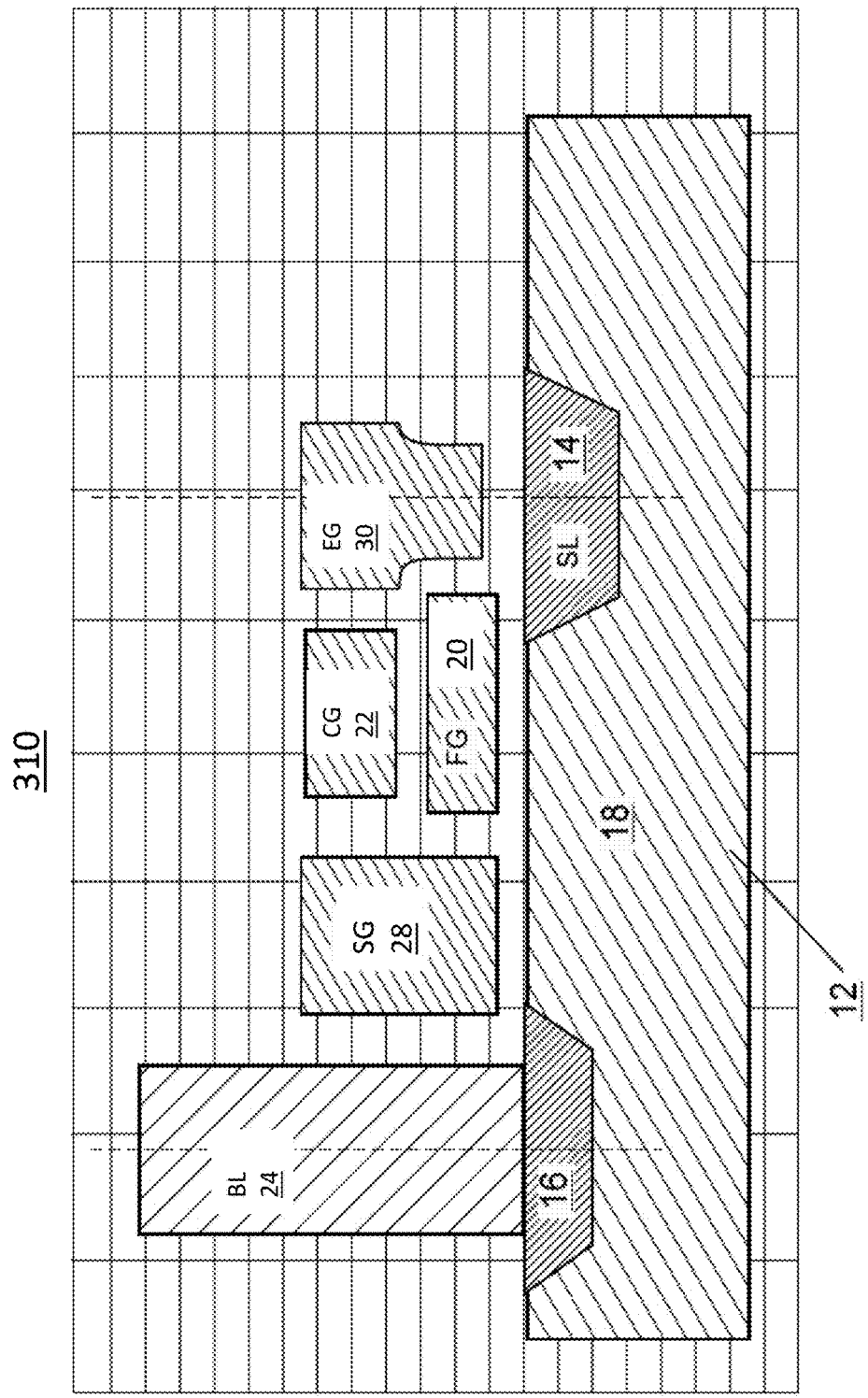
FIG. 3 is a cross-sectional side view of a conventional 4-gate non-volatile memory cell.

Other split gate memory cell configurations are known. For example, FIG. 3 depicts four-gate memory cell 310 comprising source region 14, drain region 16, floating gate 20 over a first portion of channel region 18, a select gate 28 (typically coupled to a word line) over a second portion of the channel region 18, a control gate 22 over the floating gate 20, and an erase gate 30 over the source region 14. This configuration is described in U.S. Pat. No. 6,747,310, which is incorporated herein by reference for all purposes). Here, all gates are non-floating gates except floating gate 20, meaning that they are electrically connected or connectable to a voltage source. Programming is shown by heated electrons from the channel region 18 injecting themselves onto the floating gate 20. Erasing is shown by electrons tunneling from the floating gate 20 to the erase gate 30.

Table No. 2 depicts typical voltage ranges that can be applied to the terminals of memory cell 310 for performing read, erase, and program operations:

TABLE No. 2

Operation of Flash Memory Cell 310 of FIG. 3

|  | WL/SG | BL | CG | EG | SL |
|---|---|---|---|---|---|
| Read | 1.0-2 V | 0.6-2 V | 0-2.6 V | 0-2.6 V | 0 V |
| Erase | −0.5 V/0 V | 0 V | 0 V/−8 V | 8-12 V | 0 V |
| Program | 1 V | 1 µA | 8-11 V | 4.5-9 V | 4.5-5 V |

Figure 4:
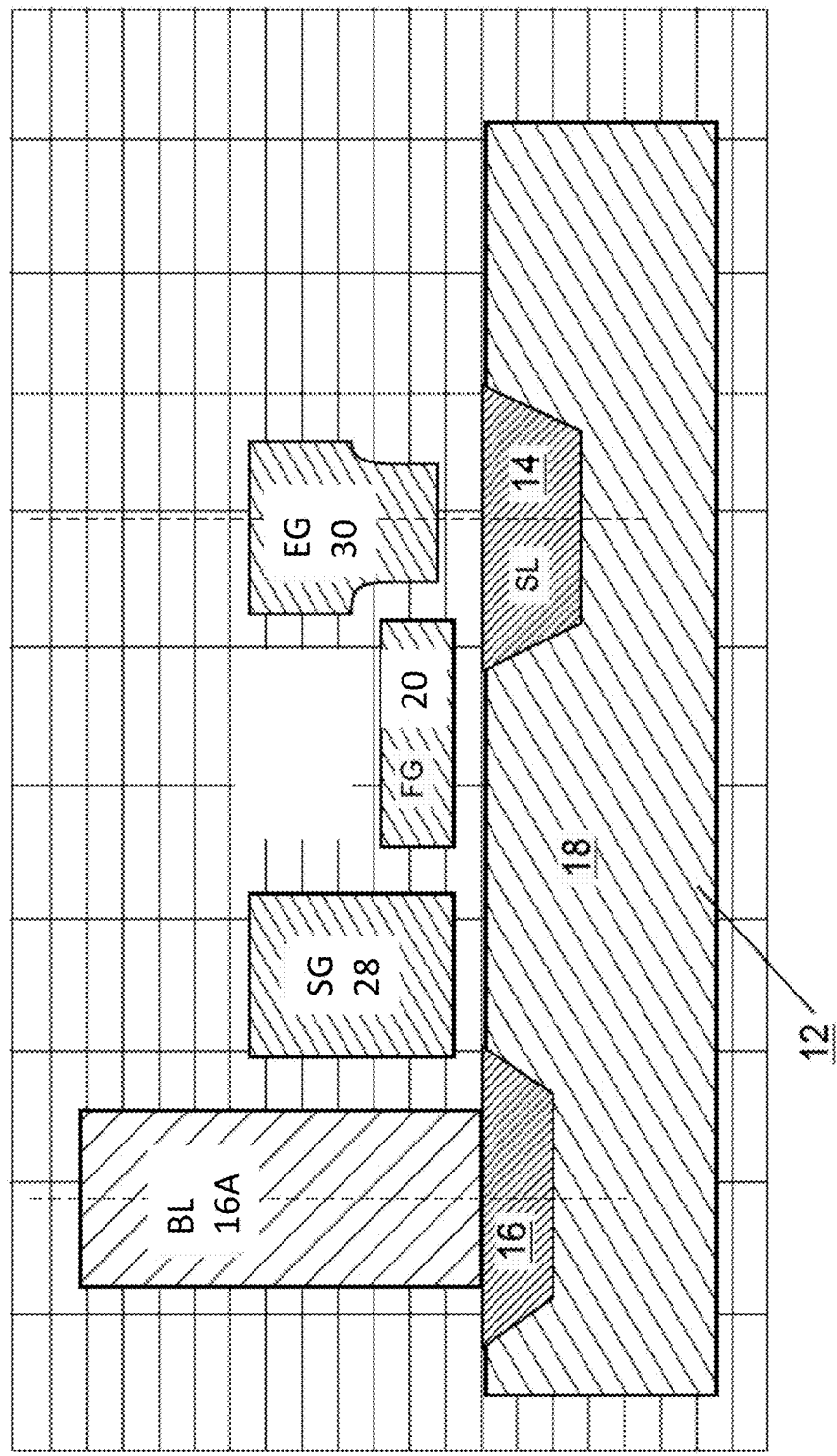
FIG. 4 is a cross-sectional side view of conventional 3-gate non-volatile memory cell.

FIG. 4 depicts split gate three-gate memory cell 410. Memory cell 410 is identical to the memory cell 310 of FIG. 3 except that memory cell 410 does not have a separate control gate. The erase operation (erasing through erase gate) and read operation are similar to that of the FIG. 3 except there is no control gate bias. The programming operation also is done without the control gate bias, hence the program voltage on the source line is higher to compensate for lack of control gate bias.

Table No. 3 depicts typical voltage ranges that can be applied to the terminals of memory cell 410 for performing read, erase, and program operations:

TABLE No. 3

Operation of Flash Memory Cell 410 of FIG. 4

|  | WL/SG | BL | EG | SL |
|---|---|---|---|---|
| Read | 0.7-2.2 V | 0.6-2 V | 0-2.6 V | 0 V |
| Erase | −0.5 V/0 V | 0 V | 11.5 V | 0 V |
| Program | 1 V | 2-3 μA | 4.5 V | 7-9 V |

Figure 5:
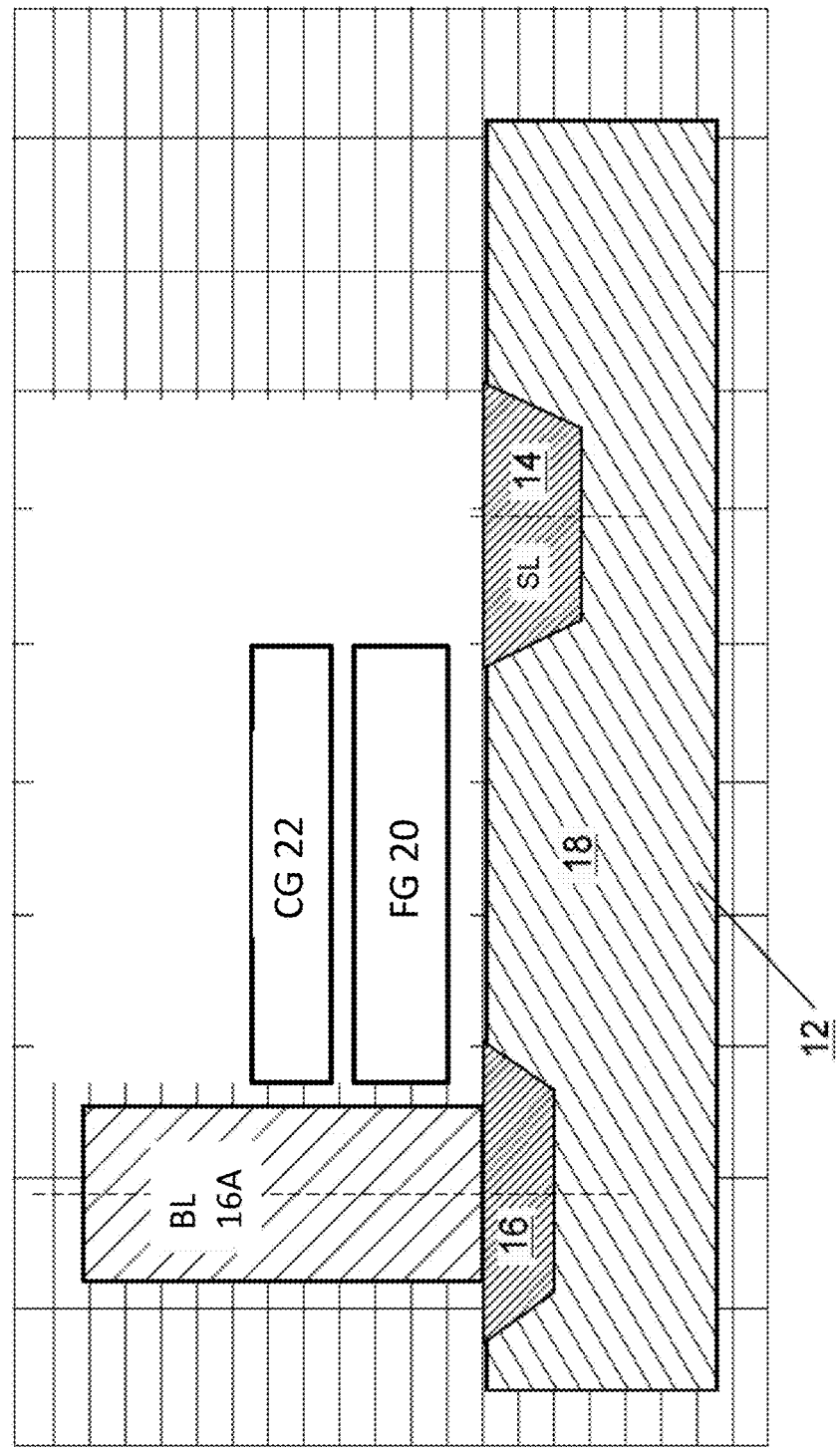
FIG. 5 is a cross-sectional side view of another conventional 2-gate non-volatile memory cell.

FIG. 5 depicts stacked gate memory cell 510. Memory cell 510 is similar to memory cell 210 of FIG. 2, except floating gate 20 extends over the entire channel region 18, and control gate 22 extends over floating gate 20, separated by an insulating layer. The erase, programming, and read operations operate in a similar manner to that described previously for memory cell 210.

Table No. 4 depicts typical voltage ranges that can be applied to the terminals of memory cell 510 for performing read, erase, and program operations:

TABLE No. 4

Operation of Flash Memory Cell 510 of FIG. 5

|  | CG | BL | SL | P-sub |
|---|---|---|---|---|
| Read | 2-5 V | 0.6-2 V | 0 V | 0 V |
| Erase | −8 to −10 V/0 V | FLT | FLT | 8-10 V/15-20 V |
| Program | 8-12 V | 3-5 V | 0 V | 0 V |

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cells in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapsis weights of the neural network.

Neural Networks Employing Non-Volatile Memory Cell Arrays

Figure 6:
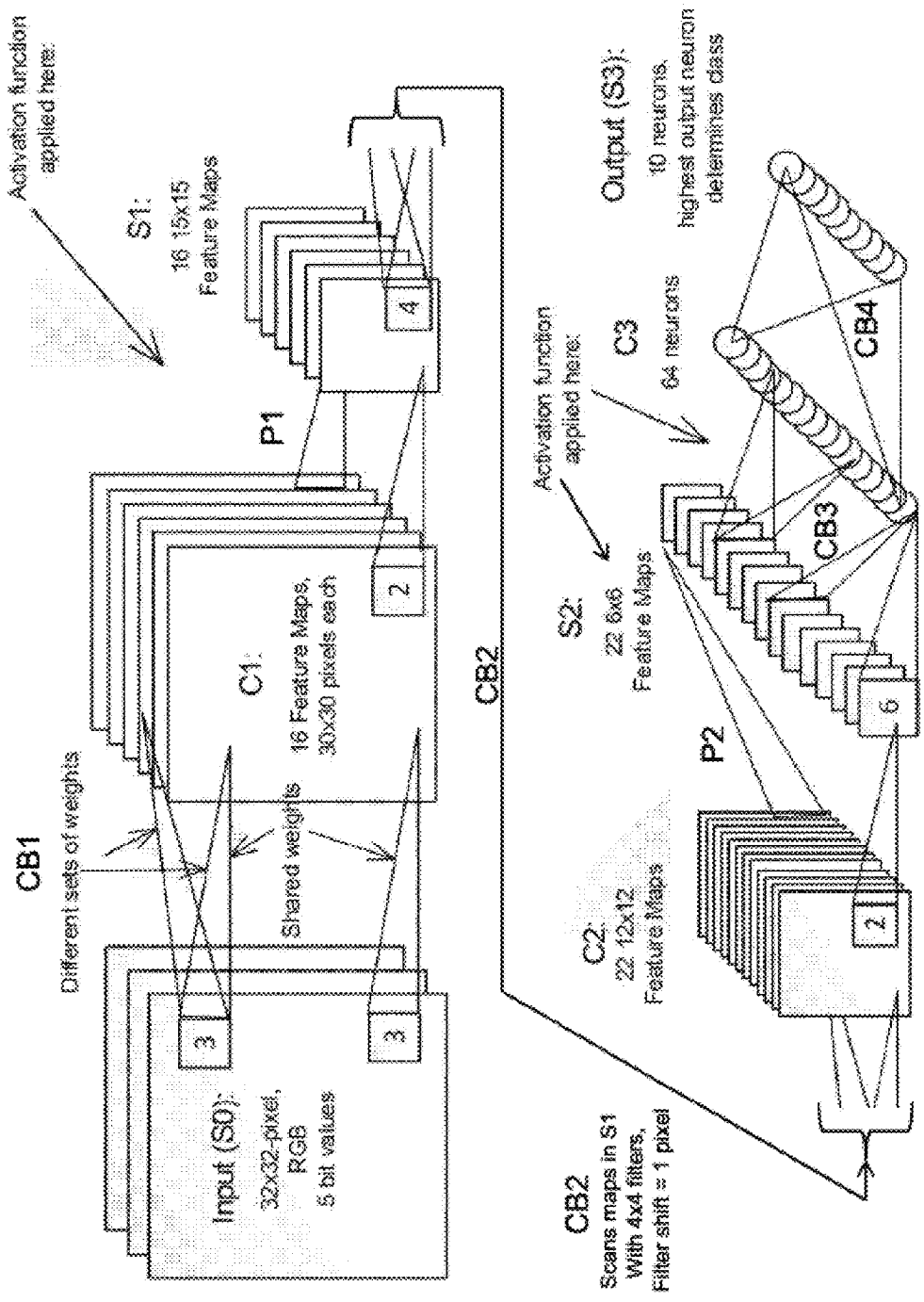
FIG. 6 is a diagram illustrating the different levels of an exemplary artificial neural network utilizing a non-volatile memory array.

FIG. 6 conceptually illustrates a non-limiting example of a neural network utilizing a non-volatile memory array. This example uses the non-volatile memory array neural net for a facial recognition application, but any other appropriate application could be implemented using a non-volatile memory array based neural network.

S0 is the input, which for this example is a 32×32 pixel RGB image with 5 bit precision (i.e. three 32×32 pixel arrays, one for each color R, G and B, each pixel being 5 bit precision). The synapses CB1 going from S0 to C1 have both different sets of weights and shared weights, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, whereby these 9 input values are multiplied by the appropriate weights and, after summing the outputs of that multiplication, a single output value is determined and provided by a first neuron of CB1 for generating a pixel of one of the layers of feature map C1. The 3×3 filter is then shifted one pixel to the right (i.e., adding the column of three pixels on the right, and dropping the column of three pixels on the left), whereby the 9 pixel values in this newly positioned filter are provided to the synapses CB1, whereby they are multiplied by the same weights and a second single output value is determined by the associated neuron. This process is continued until the 3×3 filter scans across the entire 32×32 pixel image, for all three colors and for all bits (precision values). The process is then repeated using different sets of weights to generate a different feature map of C1, until all the features maps of layer C1 have been calculated.

At C1, in the present example, there are 16 feature maps, with 30×30 pixels each. Each pixel is a new feature pixel extracted from multiplying the inputs and kernel, and therefore each feature map is a two dimensional array, and thus in this example the synapses CB1 constitutes 16 layers of two dimensional arrays (keeping in mind that the neuron layers and arrays referenced herein are logical relationships, not necessarily physical relationships—i.e., the arrays are not necessarily oriented in physical two dimensional arrays). Each of the 16 feature maps is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from C1 to S1, which pools values from consecutive, non-overlapping 2×2 regions in each feature map. The purpose of the pooling stage is to average out the nearby location (or a max function can also be used), to reduce the dependence of the edge location for example and to reduce the data size before going to the next stage. At S1, there are 16 15×15 feature maps (i.e., sixteen different arrays of 15×15 pixels each). The synapses and associated neurons in CB2 going from S1 to C2 scan maps in S1 with 4×4 filters, with a filter shift of 1 pixel. At C2, there are 22 12×12 feature maps. An activation function P2 (pooling) is applied before going from C2 to S2, which pools values from consecutive non-overlapping 2×2 regions in each feature map. At S2, there are 22 6×6 feature maps. An activation function is applied at the synapses CB3 going from S2 to C3, where every neuron in C3 connects to every map in S2. At C3, there are 64 neurons. The synapses CB4 going from C3 to the output S3 fully connects S3 to C3. The output at S3 includes 10 neurons, where the highest output neuron determines the class. This output could, for example, be indicative of an identification or classification of the contents of the original image.

Figure 7:
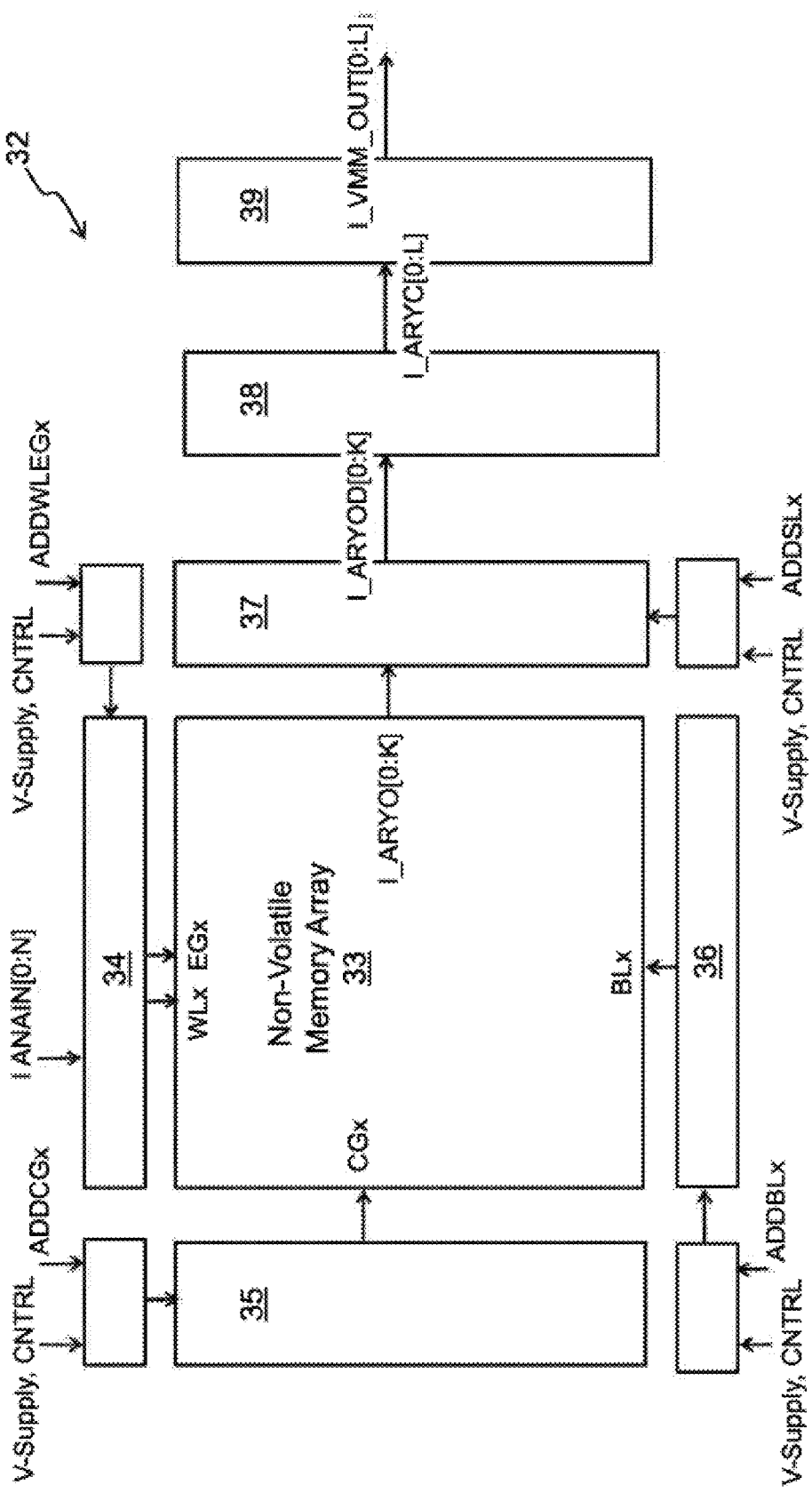
FIG. 7 is a block diagram illustrating a vector multiplier matrix.

Each level of synapses is implemented using an array, or a portion of an array, of non-volatile memory cells. FIG. 7 is a block diagram of the vector-by-matrix multiplication (VMM) array that includes the non-volatile memory cells, and is utilized as the synapses between an input layer and the next layer. Specifically, the VMM 32 includes an array of non-volatile memory cells 33, erase gate and word line gate decoder 34, control gate decoder 35, bit line decoder 36 and source line decoder 37, which decode the inputs for the memory array 33. Source line decoder 37 in this example also decodes the output of the memory cell array. Alternatively, bit line decoder 36 can decode the output of the memory array. The memory array serves two purposes. First, it stores the weights that will be used by the VMM. Second, the memory array effectively multiplies the inputs by the weights stored in the memory array and adds them up per output line (source line or bit line) to produce the output, which will be the input to the next layer or input to the final layer. By performing the multiplication and addition function, the memory array negates the need for separate multiplication and addition logic circuits and is also power efficient due to in-situ memory computation.

The output of the memory array is supplied to a differential summer (such as summing op-amp) 38, which sums up the outputs of the memory cell array to create a single value for that convolution. The differential summer is such as to realize summation of positive weight and negative weight with positive input. The summed up output values are then supplied to the activation function circuit 39, which rectifies the output. The activation function may include sigmoid, tan h, or ReLU functions. The rectified output values become an element of a feature map as the next layer (C1 in the description above for example), and are then applied to the next synapse to produce next feature map layer or final layer. Therefore, in this example, the memory array constitutes a plurality of synapses (which receive their inputs from the prior layer of neurons or from an input layer such as an image database), and summing op-amp 38 and activation function circuit 39 constitute a plurality of neurons.

Figure 8:
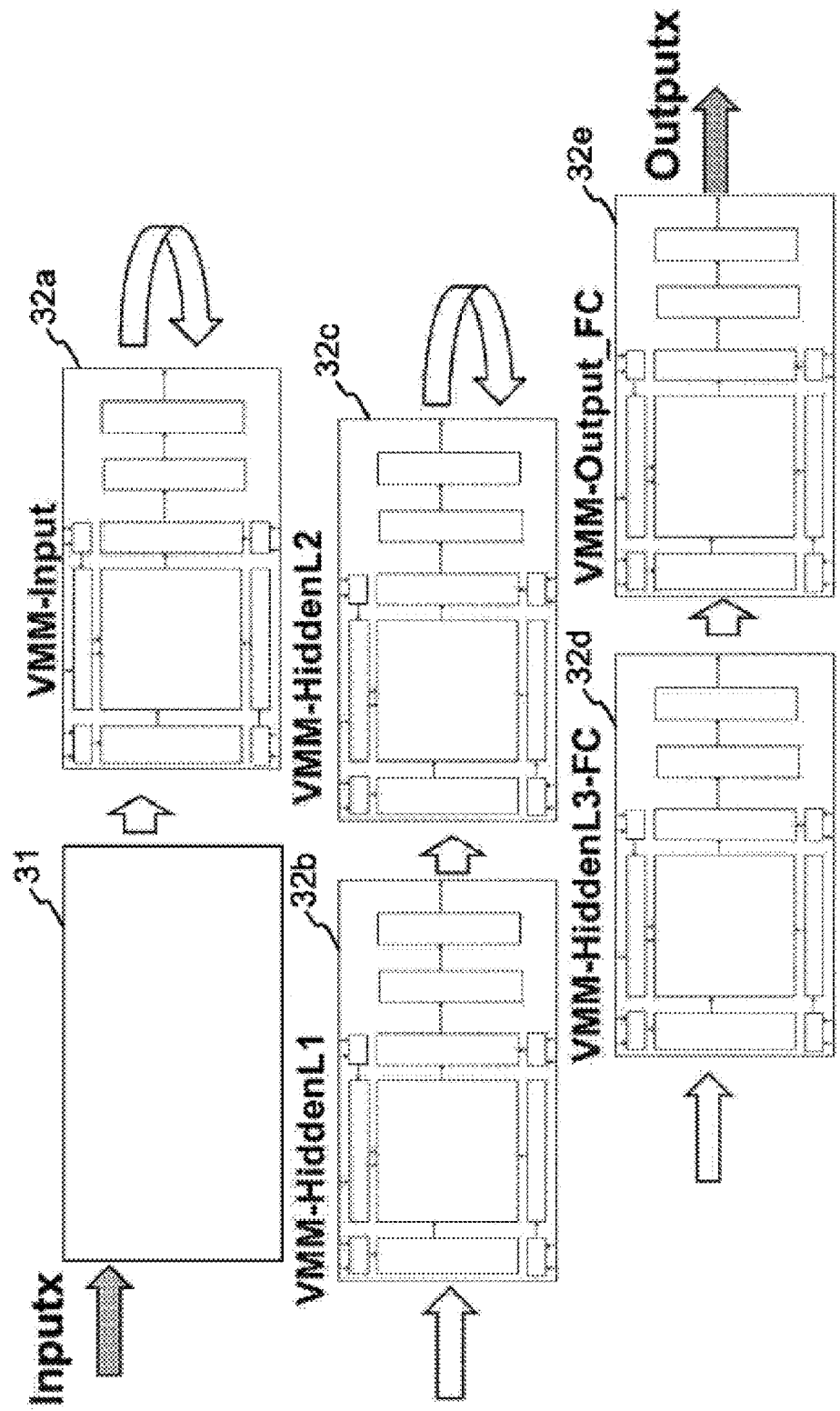
FIG. 8 is a block diagram illustrating various levels of a vector multiplier matrix.

FIG. 8 is a block diagram of the various levels of VMM. The input is converted from digital to analog by digital-to-analog converter 31, and provided to input VMM 32a. The output generated by the input VMM 32a is provided as an input to the next VMM (hidden level 1) 32b, which in turn generates an output that is provided as an input to the next VMM (hidden level 2) 32b, and so on. The various layers of VMM's 32 function as different layers of synapses and neurons of a convolutional neural network (CNN). Each VMM can be a stand-alone non-volatile memory array, or multiple VMMs could utilize different portions of the same non-volatile memory array, or multiple VMMs could utilize overlapping portions of the same non-volatile memory array.

Vector-by-Matrix Multiplication (VMM) Arrays

Figure 9:
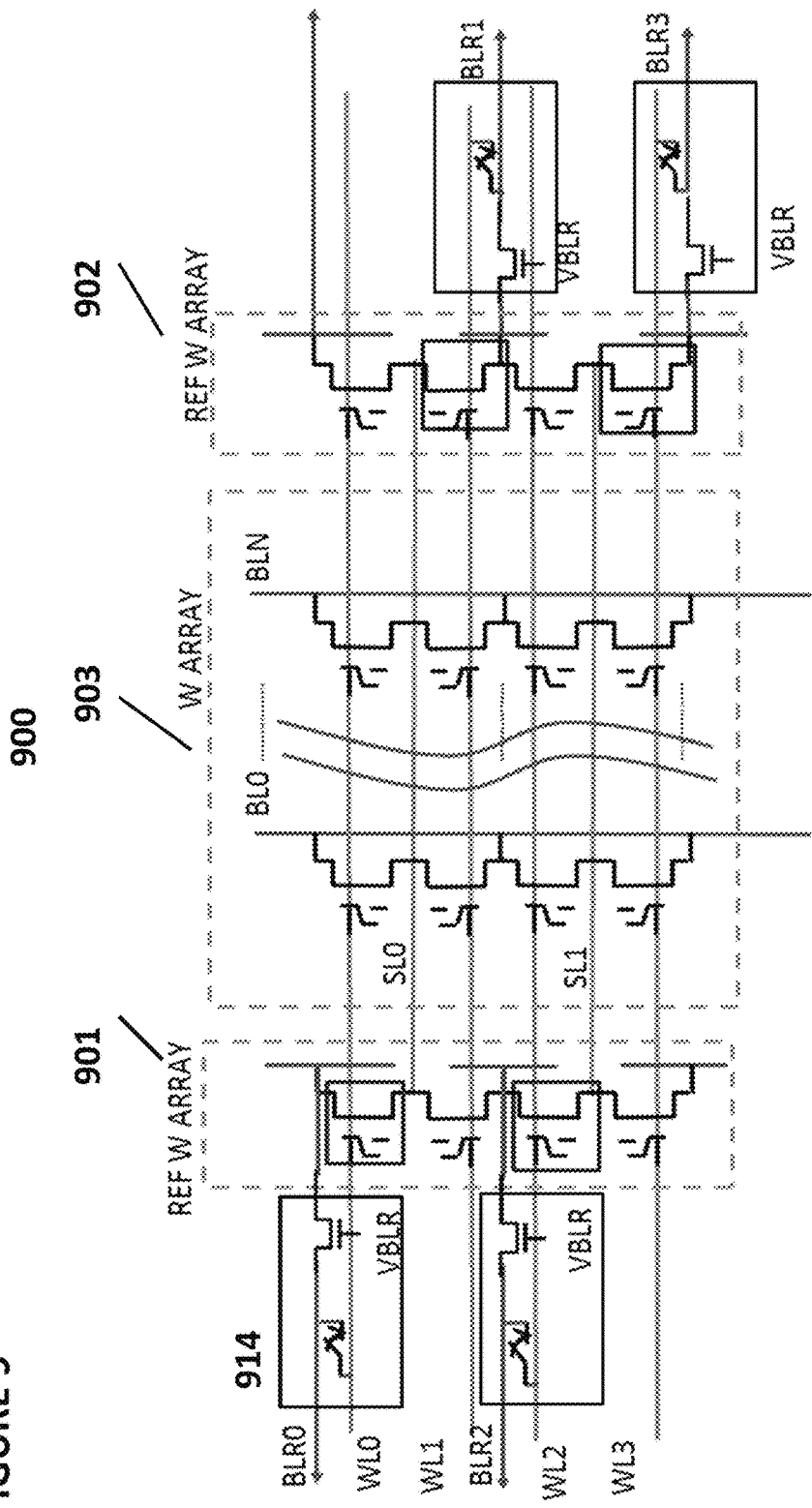
FIG. 9 depicts an embodiment of a vector multiplier matrix.

FIG. 9 depicts neuron VMM 900, which is particularly suited for memory cells of the type shown in FIG. 2, and is utilized as the synapses and parts of neurons between an input layer and the next layer. VMM 900 comprises a memory array 903 of non-volatile memory cells, reference array 901, and reference array 902. Reference arrays 901 and 902 serve to convert current inputs flowing into terminals BLR0-3 into voltage inputs WL0-3. Reference arrays 901 and 902 as shown are in the column direction. In general, the reference array direction is orthogonal to the input lines. In effect, the reference memory cells are diode connected through multiplexors (multiplexor 914, which includes a multiplexor and a cascoding transistor VBLR for biasing the reference bit line) with current inputs flowing into them. The reference cells are tuned to target reference levels.

Memory array 903 serves two purposes. First, it stores the weights that will be used by the VMM 900. Second, memory array 903 effectively multiplies the inputs (current inputs provided in terminals BLR0-3; reference arrays 901 and 902 convert these current inputs into the input voltages to supply to wordlines WL0-3) by the weights stored in the memory array to produce the output, which will be the input to the next layer or input to the final layer. By performing the multiplication function, the memory array negates the need for separate multiplication logic circuits and is also power efficient. Here, the voltage inputs are provided on the word lines, and the output emerges on the bit line during a read (inference) operation. The current placed on the bit line performs a summing function of all the currents from the memory cells connected to the bitline.

FIG. 10 depicts operating voltages for VMM 900. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

Figure 11:
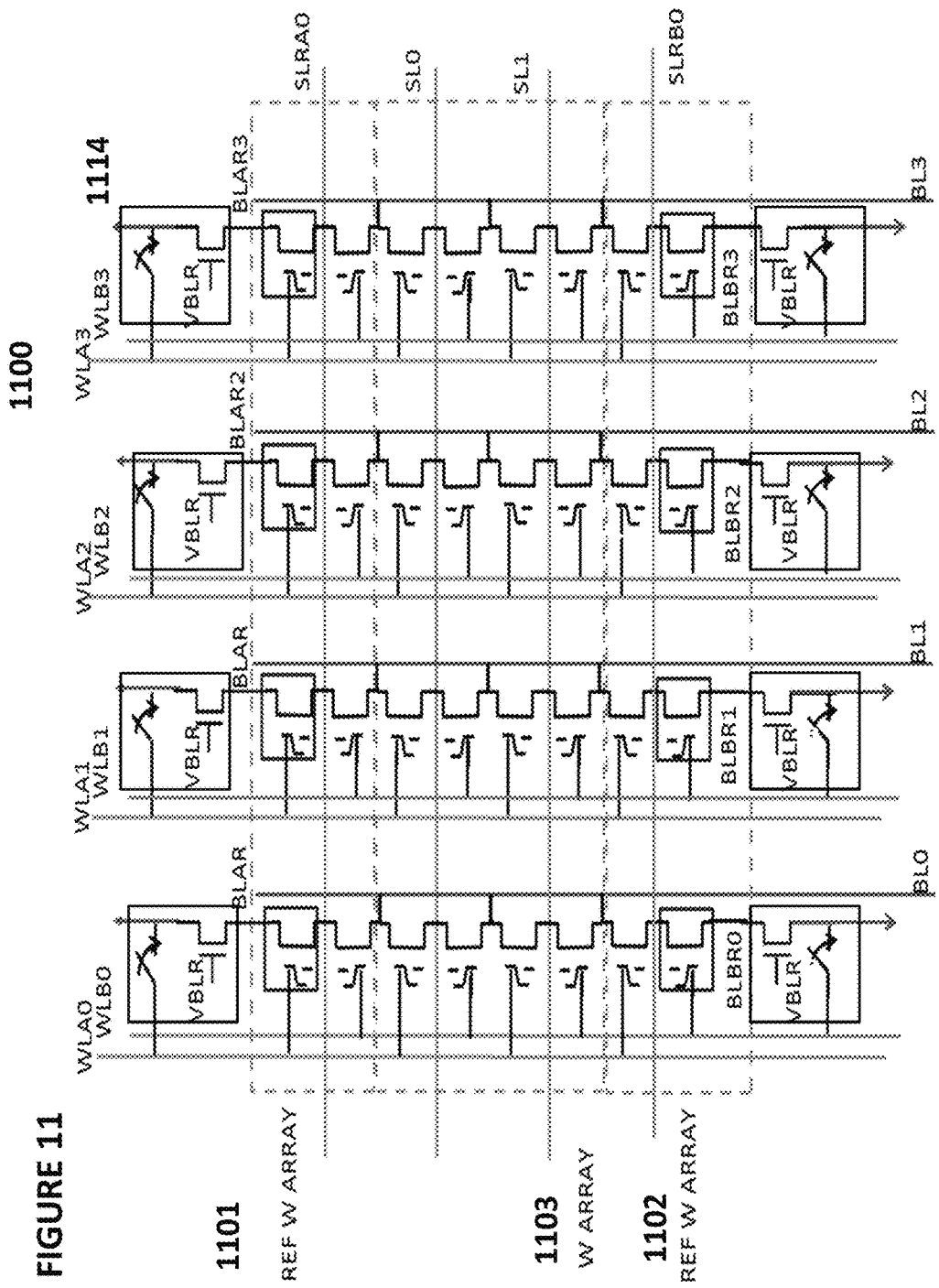
FIG. 11 depicts another embodiment of a vector multiplier matrix.

FIG. 11 depicts neuron VMM 1100, which is particularly suited for memory cells of the type shown in FIG. 2, and is utilized as the synapses and parts of neurons between an input layer and the next layer. VMM 1100 comprises a memory array 1103 of non-volatile memory cells, reference array 1101, and reference array 1102. VMM 1100 is similar to VMM 900 except that in VMM 1100 the word lines run in the vertical direction. There are two reference arrays 1101 (at the top, which provides a reference converting input current into voltage for the even rows) and 1102 (at the bottom, which provides a reference converting input current into voltage for the odd rows). Here, the inputs are provided on the word lines, and the output emerges on the source line during a read operation. The current placed on the source line performs a summing function of all the currents from the memory cells connected to the source line.

FIG. 12 depicts operating voltages for VMM 1100. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

Figure 13:
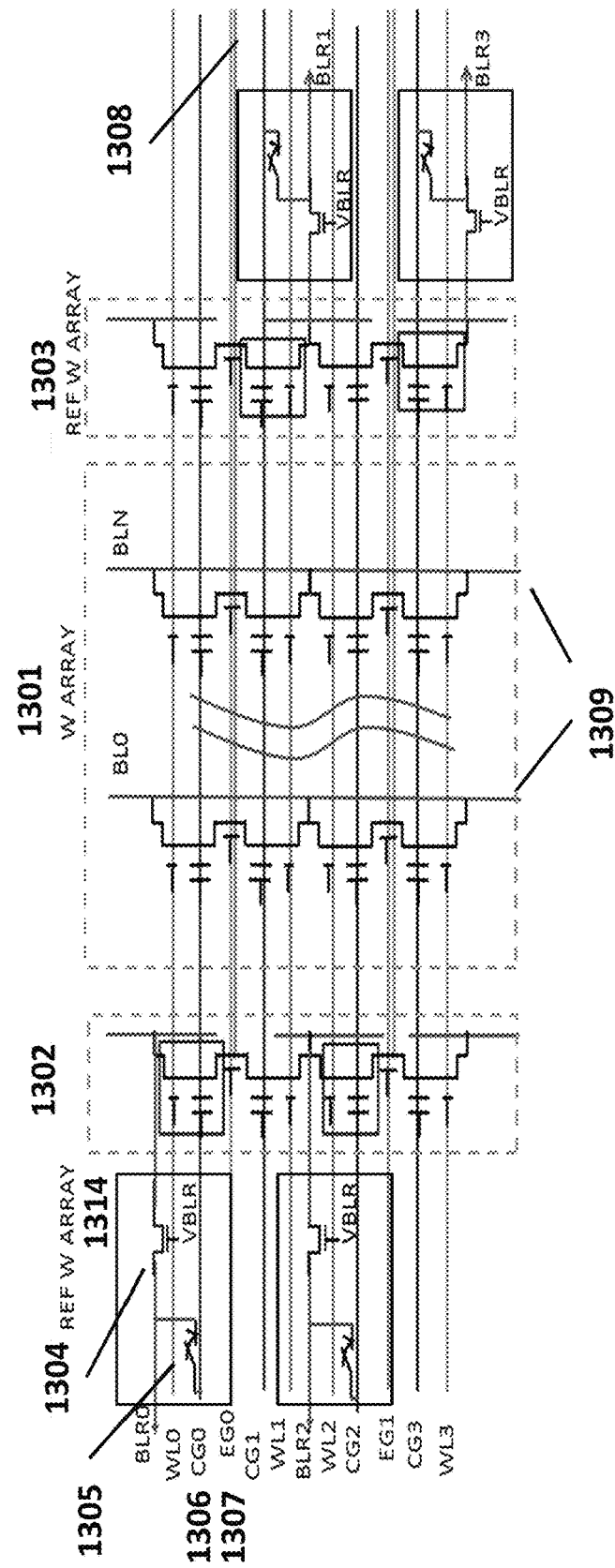
FIG. 13 depicts another embodiment of a vector multiplier matrix.

FIG. 13 depicts neuron VMM 1300, which is particularly suited for memory cells of the type shown in FIG. 3, and is utilized as the synapses and parts of neurons between an input layer and the next layer. VMM 1300 comprises a memory array 1301 of non-volatile memory cells, reference array 1302 (providing reference converting input current into input voltage for even rows), and reference array 1303 (providing reference converting input current into input voltage for odd rows). VMM 1300 is similar to VMM 900 except VMM 1300 further comprises control line 1306 couples to the control gates of a row of memory cells and control line 1307 coupled to the erase gates of adjoining rows of memory cells. Here, the wordlines, control gate lines, and erase gate lines are of the same direction. VMM further comprises reference bit line select transistor 1304 (part of mux 1314) that selectively couples a reference bit line to the bit line contact of a selected reference memory cell and switch 1305 (part of mux 1314) that selectively couples a reference bit line to control line 1306 for a particular selected reference memory cell. Here, the inputs are provided on the word lines (of memory array 1301), and the output emerges on the bit line, such as bit line 1309, during a read operation. The current placed on the bit line performs a summing function of all the currents from the memory cells connected to the bit line.

FIG. 14 depicts operating voltages for VMM 1300. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

Figure 15:
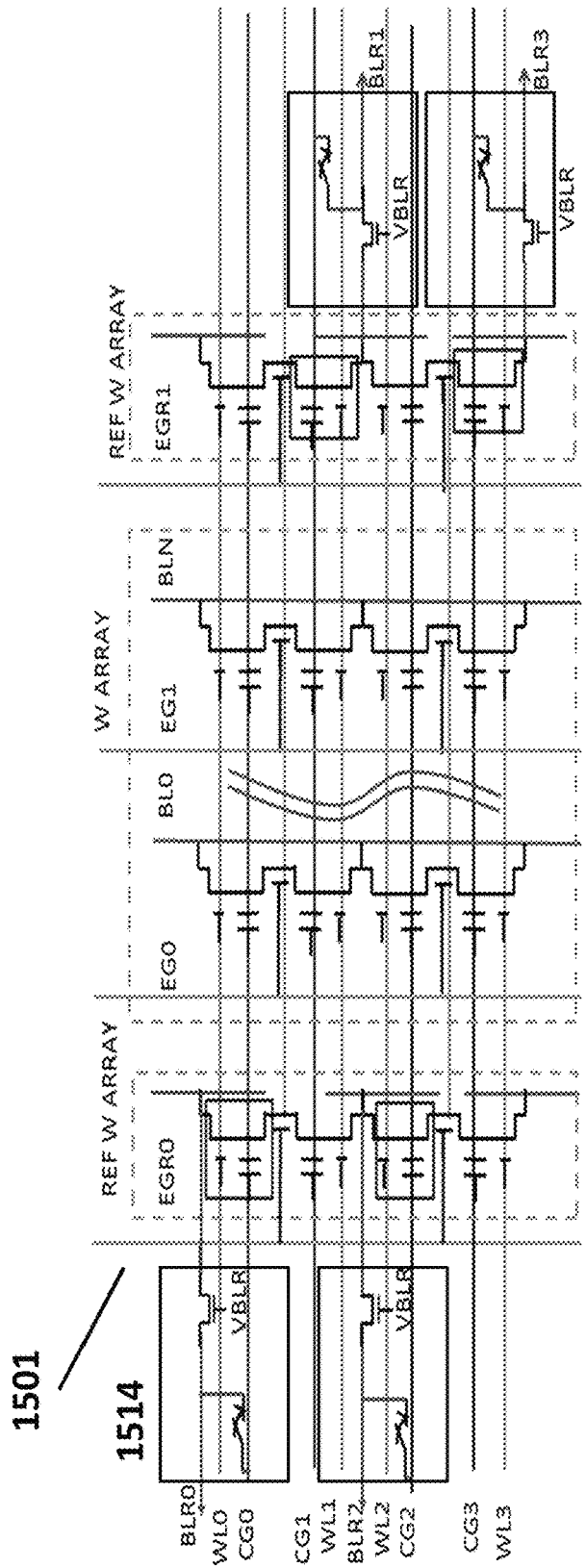
FIG. 15 depicts another embodiment of a vector multiplier matrix.

FIG. 15 depicts neuron VMM 1500, which is particularly suited for memory cells of the type shown in FIG. 3, and is utilized as the synapses and parts of neurons between an input layer and the next layer. VMM 1500 is similar to VMM 1100, except in VMM 1500, erase gate lines such as erase gate line 1501 run in a vertical direction. Here, the inputs are provided on the word lines, and the output emerges on the source lines. The current placed on the bit line performs a summing function of all the currents from the memory cells connected to the bit line.

FIG. 16 depicts operating voltages for VMM 1500. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

Figure 17:
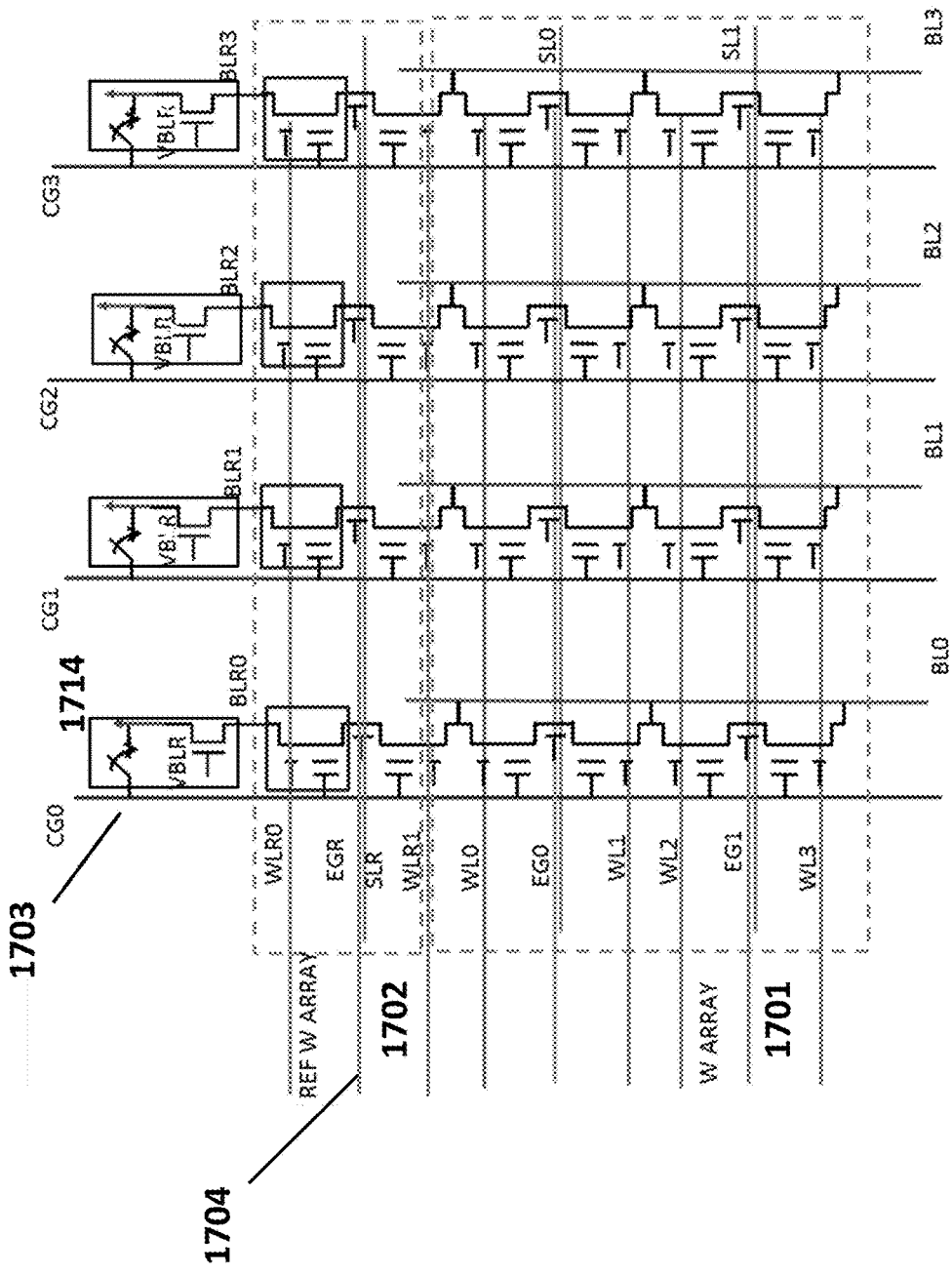
FIG. 17 depicts another embodiment of a vector multiplier matrix.

FIG. 17 depicts neuron VMM 1700, which is particularly suited for memory cells of the type shown in FIG. 3, and is utilized as the synapses and parts of neurons between an input layer and the next layer. VMM 1700 comprises a memory array 1701 of non-volatile memory cells and reference array 1702 (at the top of the array). Alternatively, another reference array can be placed at the bottom, similar to that of FIG. 10. In other respects, VMM 1700 is similar to previously-described VMMs, except in VMM 1700, control gates line such as control gate line 1703 run in a vertical direction (hence reference array 1702 in the row direction, orthogonal to the input control gate lines), and erase gate lines such as erase gate line 1704 run in a horizontal direction. Here, the inputs are provided on the control gate lines, and the output emerges on the source lines. In one embodiment only even rows are used, and in another embodiment, only odd rows are used. The current placed on the source line performs a summing function of all the currents from the memory cells connected to the source line.

As described herein for neural networks, the flash cells are preferably configured to operate in sub-threshold region.

The memory cells described herein are biased in weak inversion:

$$Ids = Io * e^{(Vg-Vth)/kVt} = w * Io * e^{(Vg)/kVt}$$

$$w = e^{(-Vth)/kVt}$$

For an I-to-V log converter using a memory cell to convert input current into an input voltage:

$$Vg = k * Vt * \log[Ids/wp * Io]$$

For a memory array used as a vector matrix multiplier VMM, the output current is:

$$Iout = wa * Io * e^{(Vg)/kVt}, \text{namely}$$

$$Iout = (wa/wp) * Iin = W * Iin$$

$$w = e^{(Vthp-Vtha)/kVt}$$

A wordline or control gate can be used as the input for the memory cell for the input voltage.

Alternatively, the flash memory cells can be configured to operate in the linear region:

$$Ids = \text{beta} * (Vgs-Vth) * Vds; \text{beta} = u * Cox * W/L$$

$$w\alpha(Vgs-Vth)$$

For an I-to-V linear converter, a memory cell operating in the linear region can be used to convert linearly an input/output current into an input/output voltage.

Other embodiments for the ESF vector matrix multiplier are as described in U.S. patent application Ser. No. 15/826,345, which is incorporated by reference herein. A sourceline or a bitline can be used as the neuron output (current summation output).

Figure 18:
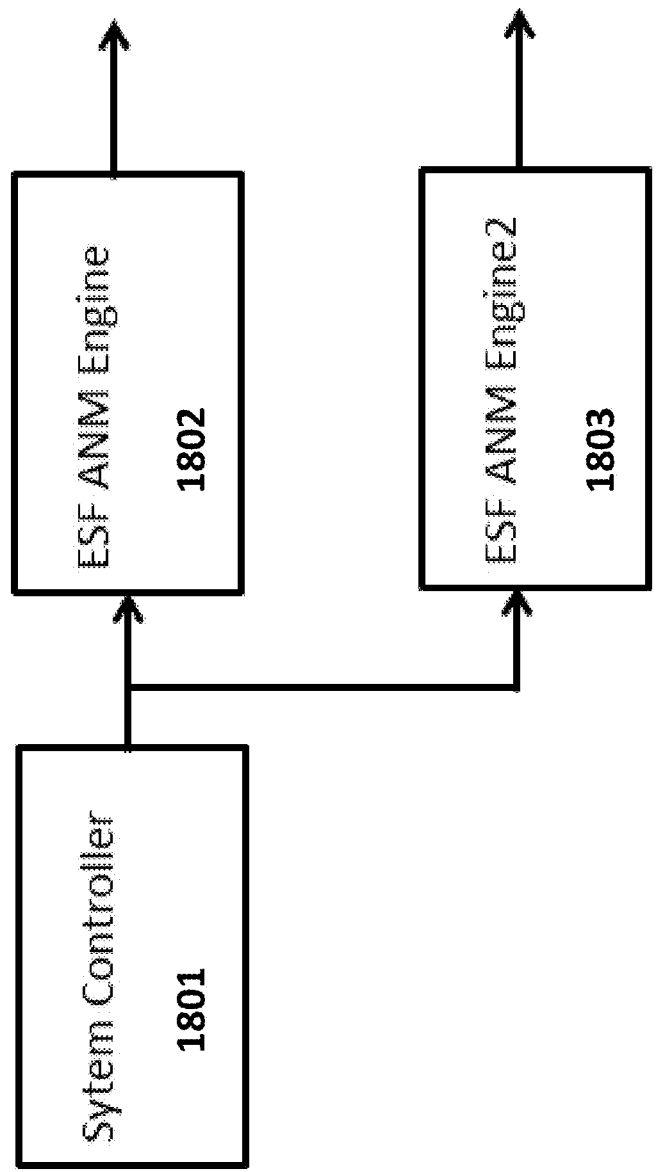
FIG. 18 depicts a system for detecting data drift in a vector multiplier matrix.

FIG. 18 depicts analog neuromorphic memory system 1800, which comprises system controller 1801, analog neuromorphic memory engine 1802, and analog neuromorphic memory engine 1803. Analog neuromorphic memory engine 1802 and analog neuromorphic memory engine 1803 each contains a VNM array that are programmed with weights. A portion of the array in the VNM in analog neuromorphic memory engine 1803 is dedicated to a process for determining if data has drifted.

Figure 19:
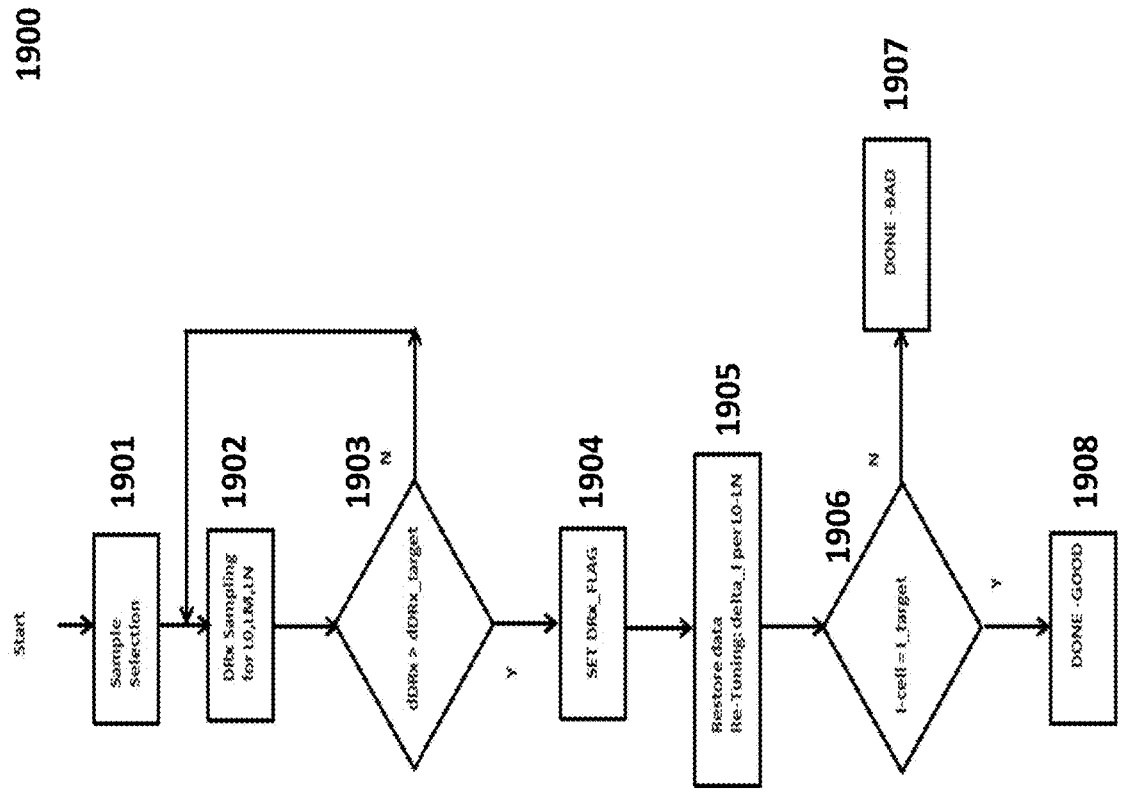
FIG. 19 depicts a data refresh method.

FIG. 19 depicts method 1900 for refreshing data in a VNM. A set of flash memory cells are sampled (sample selection in step 1901). A sample is analyzed for each possible level (N values) stored by the flash memory cells (L0, . . . LN−1), and a difference (DRx) is calculated between each pair of adjacent levels (step 1902). For each level, the difference (DRx) is compared to the target (ideal) (DRx_target) (step 1903). If any of the differences (DRx) exceeds the target, then a refresh flag is set (step 1904). A restore data process than occurs (step 1905). This step can be done by on-chip controller or by an off-chip controller. In step 1905, a re-tuning step (e.g., re-programming) is tailored for each level. First the cell is read back, then depending on the level, a delta re-tuning is applied for that level. A look up table (Icell vs. I-tuned target) can used for this purpose. In this step, a tuning algorithm (iterative verify and program) is used to reach the target (such as by using the algorithm described in U.S. patent application Ser. No. 15/826,345, which is incorporated by reference herein). The restore is also done for sampled data retention cells. Once each cell has a current equal to the target current for the level stored in that cell (step 1906), the process completes (step 1908). If that is never reached, then the cell is deemed bad and the process completes (step 1907).

Figure 20:
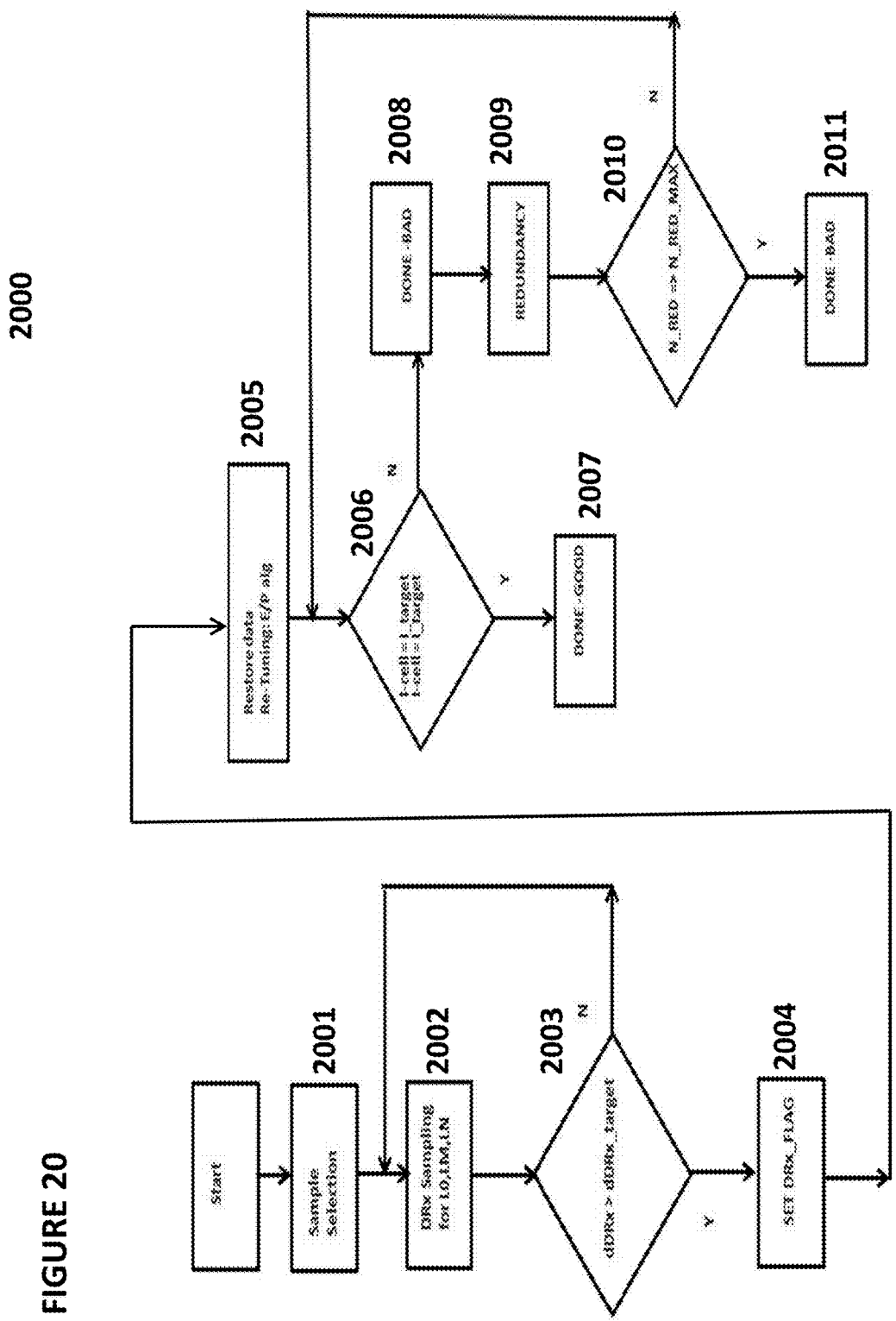
FIG. 20 depicts another data refresh method.

FIG. 20 depicts another method 2000 for refreshing data in a VNM. A set of exemplary flash memory cells are sampled (step 2001). A sample is analyzed for each possible level (N values) stored by the flash memory cells (L0, . . . LN−1), and a difference (DRx) is calculated between each pair of adjacent levels (step 2002). For each level, the difference (DRx) is compared to the target (ideal) (DRx_target) (step 2003). If any of the differences (DRx) exceeds the target, then a refresh flag is set (step 2004). A restore data process than occurs (step 2005). The restore can be done by an on-chip or off-chip controller. In step 2005, a re-tuning step (e.g., re-programming) is tailored for each level. First the cell (array cell and sampled data retention cells) is read back, then depending on the level, a delta re-tuning is applied for that level by a fine increment restore algorithm.

A look up table (Icell vs. I-tuned target) can used for this purpose. In this step, a fine tuning algorithm (fine step iterative verify and program) is used to reach the target (such as by using the algorithm described in U.S. patent application Ser. No. 15/826,345, which is incorporated by reference herein). Alternatively, the data restore can be done by re-programming the whole VMM arrays by transferring all the weights from training to the VMM arrays. Once each cell has a current equal to the target current for the level stored in that cell (step 2006), the process completes (step 2007). If that is never reached, then the cell is deemed bad (step 2008). A redundancy array sector is then used replace the bad array sector (step 2009). If the number of redundancy cells used in this manner exceeds a threshold (step 2010), then the entire sector is deemed bad (step 2011).

Figure 21:
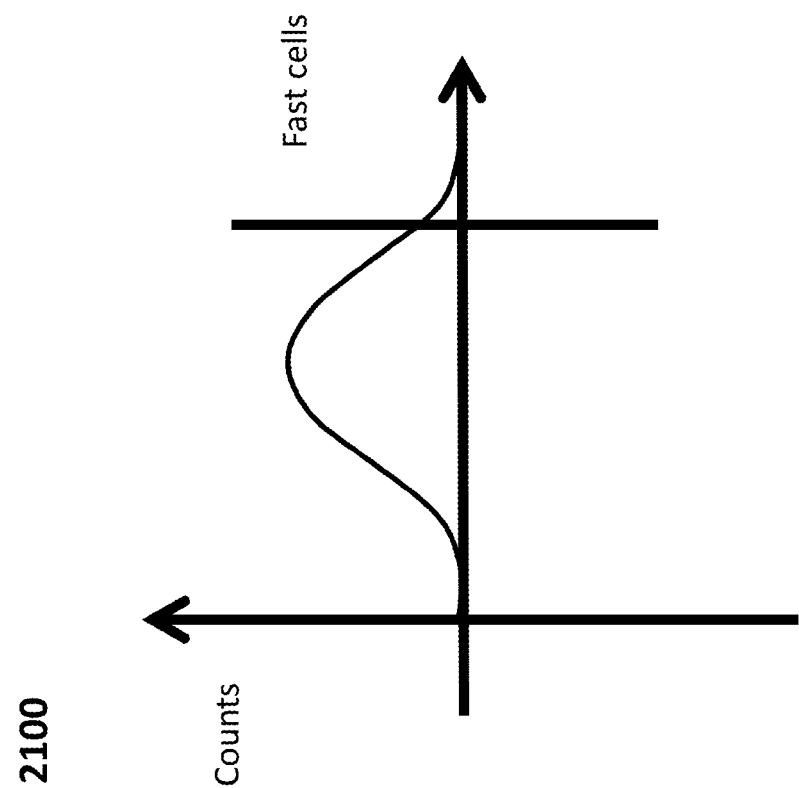
FIG. 21 depicts characteristics of fast cells in a vector multiplier matrix.
Figure 22:
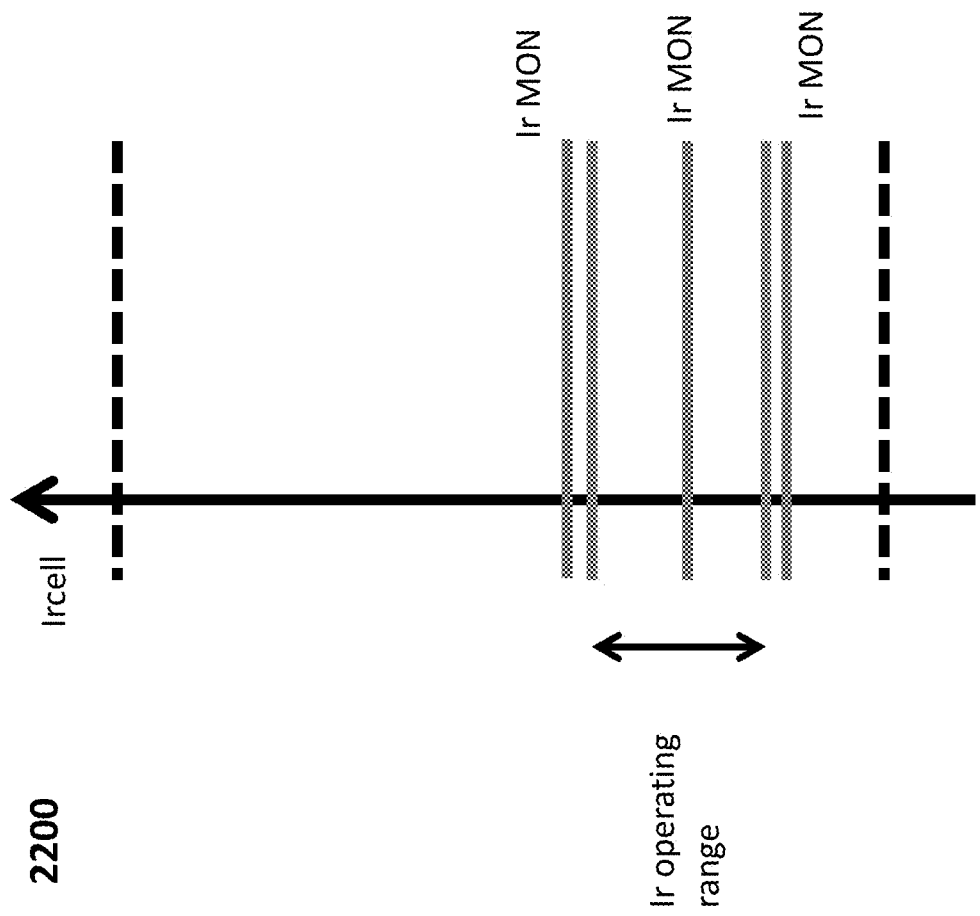
FIG. 22 depicts characteristics of fast cells in a vector multiplier matrix.

With respect to FIGS. 21 and 22, it can be desirable to identify "fast cells," which are cells which can lose charge from their floating gates during a program operation relatively quickly compared to an average cell, as such fast cells are more prone to data drift over time. In FIG. 21, fast cells can be identified, with reference to graph 2100, as those that obtain a high current level, Ircell, with relatively few programming attempts (counts). In FIG. 22, with reference to graph 2200, it is understood that a fast cell is likely to have a high Ir operating range than normal cells. FIG. 22 shows exemplary cells used to data retention (drift) monitor. Cells that exceed the minimum and maximum range are used for monitor purpose. This is used to create monitor cells with stress condition worse than normal cells.

Figure 23:
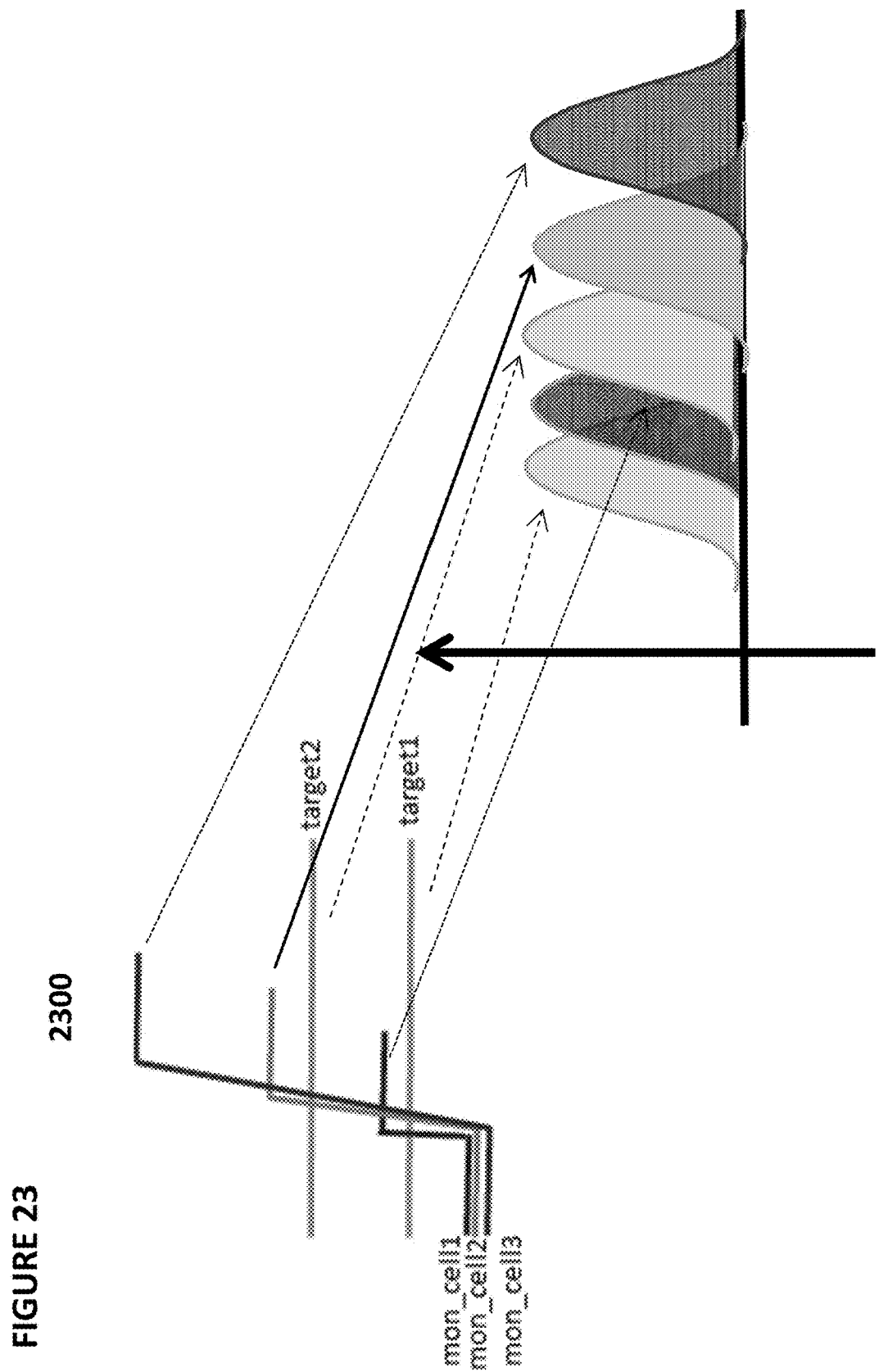
FIG. 23 depicts a mechanism for assessing data drift.

FIG. 23 depicts a data drift detection scheme. In this example, it is desired that a certain current level be between target1 and target2. If the sensed current is between those targets, then no refresh is needed, meaning the drift is acceptable for system performance. However, if the sensed current is outside of the range between target1 and target 2, then a data refresh (restore) process is performed.

Figure 24:
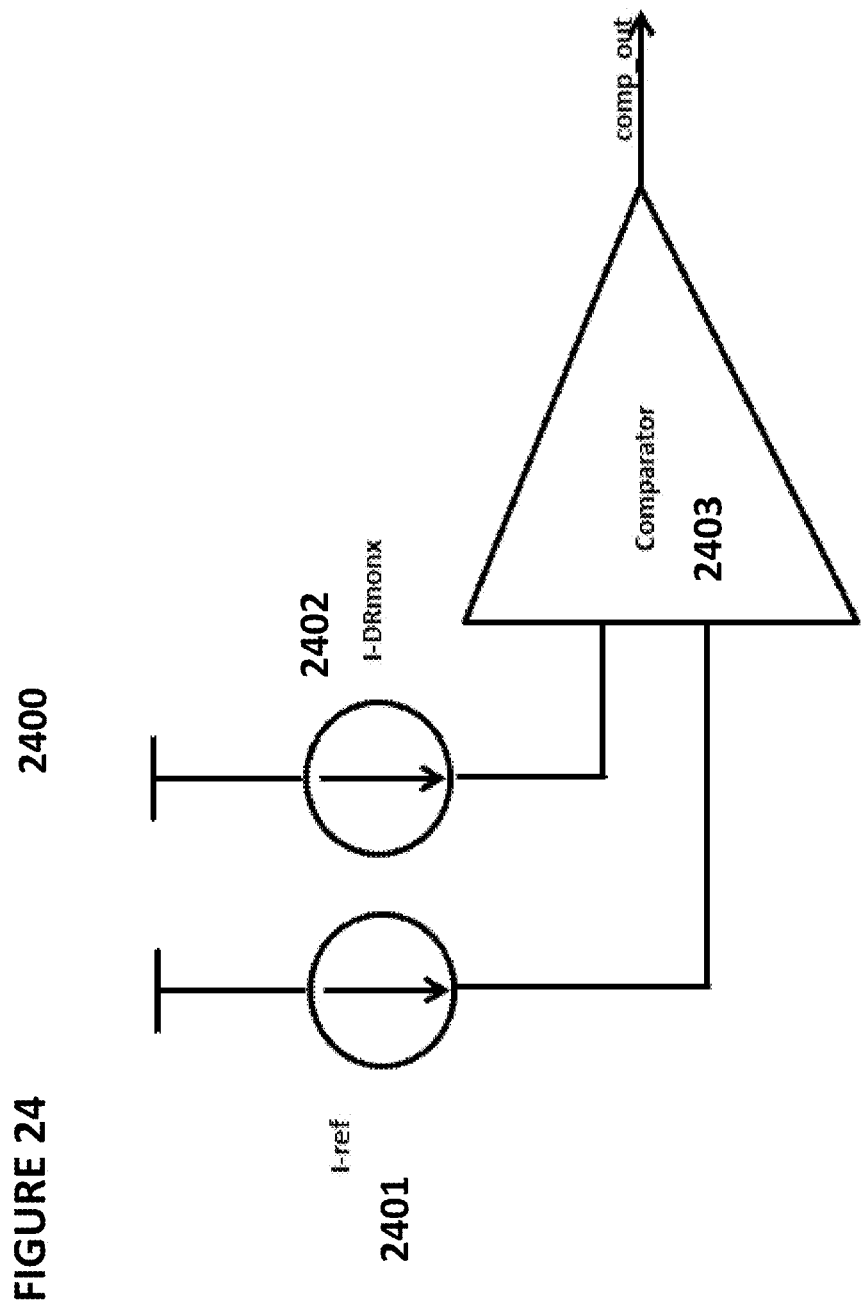
FIG. 24 depicts an embodiment of a data drift detector.

FIG. 24 depicts an embodiment of a data drift detector. Data drift detector 2400 receives current 2402 (which can be either a sensed current level through a selected cell or a difference between such currents) and a reference current 2401 in comparator 2403, which outputs a value indicating whether current 2402 exceeds reference current 2401 or not. Data drift detector 2400 compares current drawn by a selected cell with a target current based on the value that is intended to have been stored in the selected cell.

Figure 25:
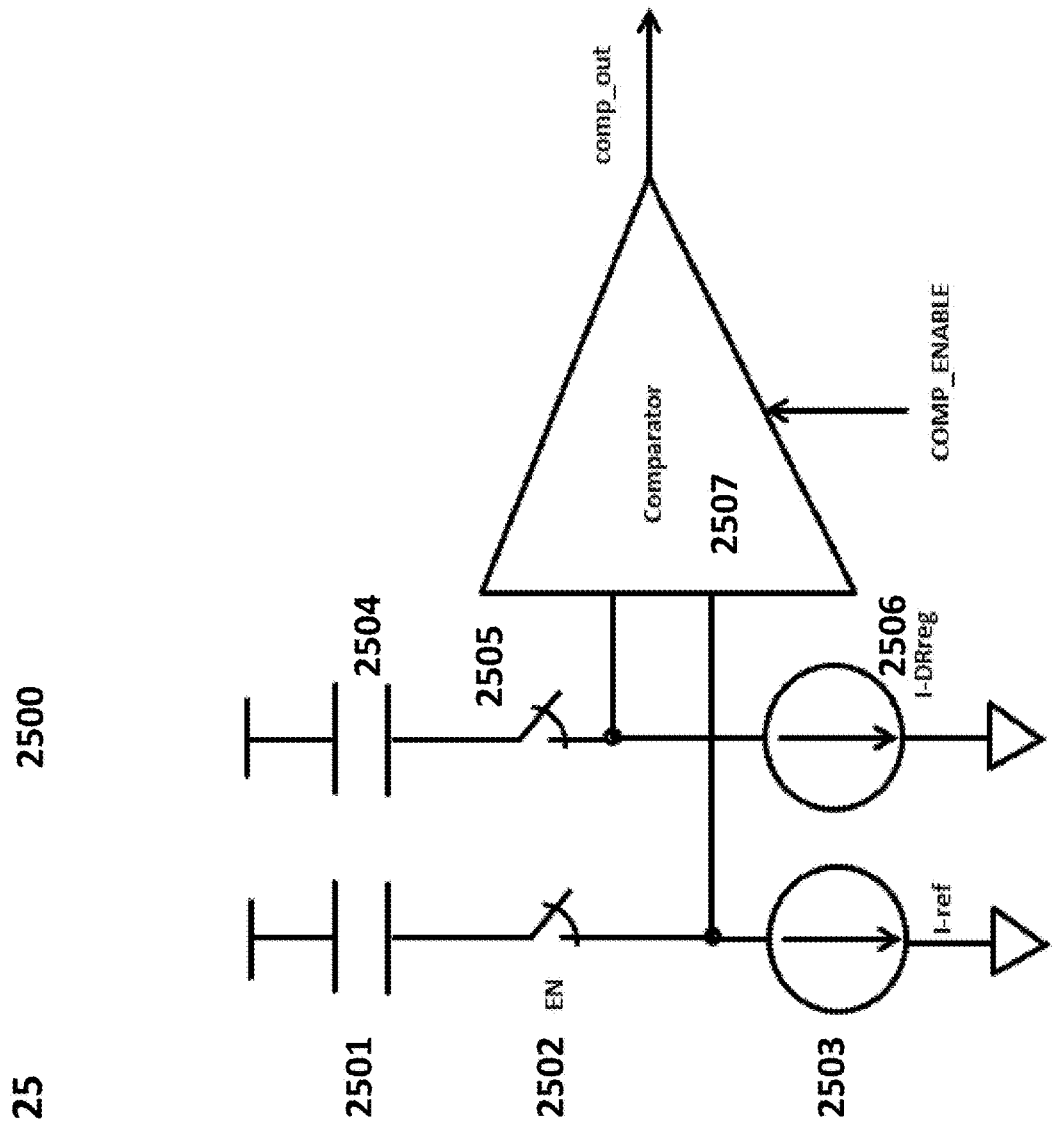
FIG. 25 depicts another embodiment of a data drift detector.

FIG. 25 depicts another embodiment of a data drift detector. Data drift detector 2500 comprises sample-and-hold capacitors 2501 and 2504, switches 2502 and 2505, current source 2506 (which can be either a sensed current level through a selected cell or a difference between such currents), reference current 2503, and comparator 2507. In this embodiment, the two current sources are sampled by the capacitors through a determined ramping time period and held, and those sampled values are then compared by comparator 2507. Thus, data drift detector 2500 compares a sampled current drawn by a selected cell with a sampled target current based on the value that is intended to have been stored in the selected cell.

Figure 26:
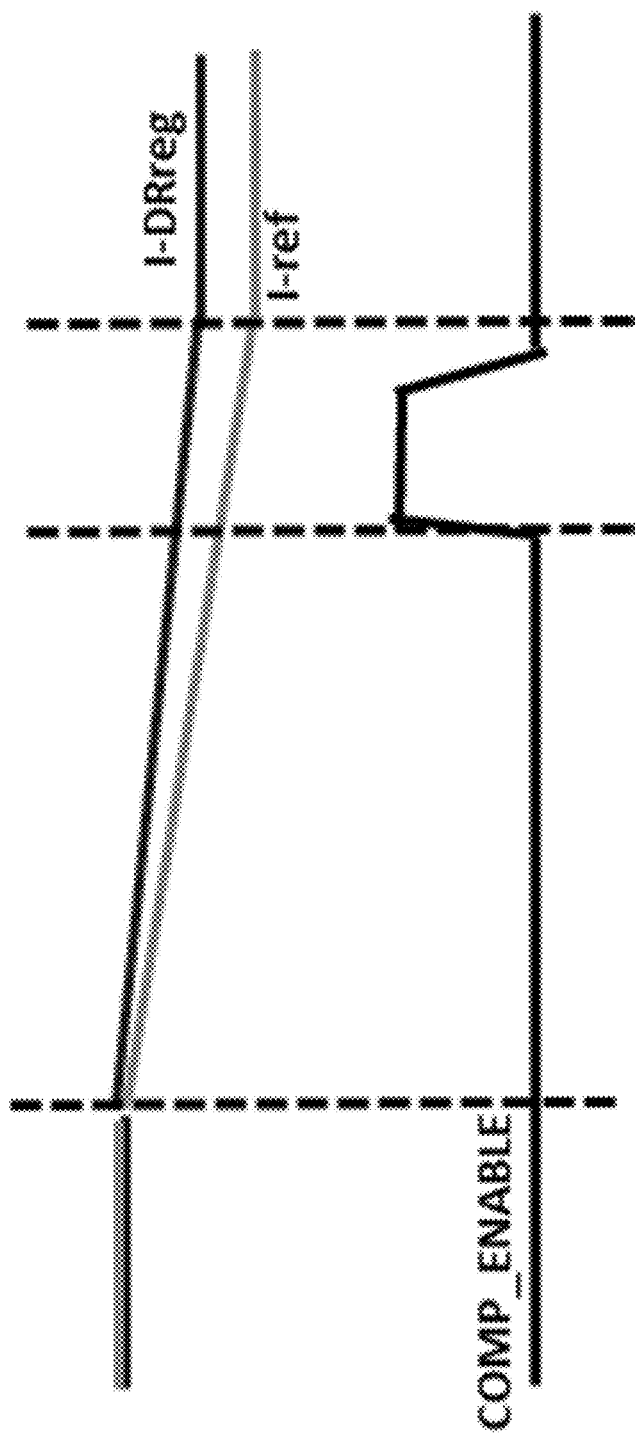
FIG. 26 depicts an exemplary sampling period for the embodiment of FIG. 25.

With reference to FIG. 26, as shown in graph 2600, the sampling period of data drift detector 2500 can be selected based on an understanding of how much time is likely to elapse before significant data drift occurs. This can result in less power consumption compared to the data drift detector 2400.

Figure 27:
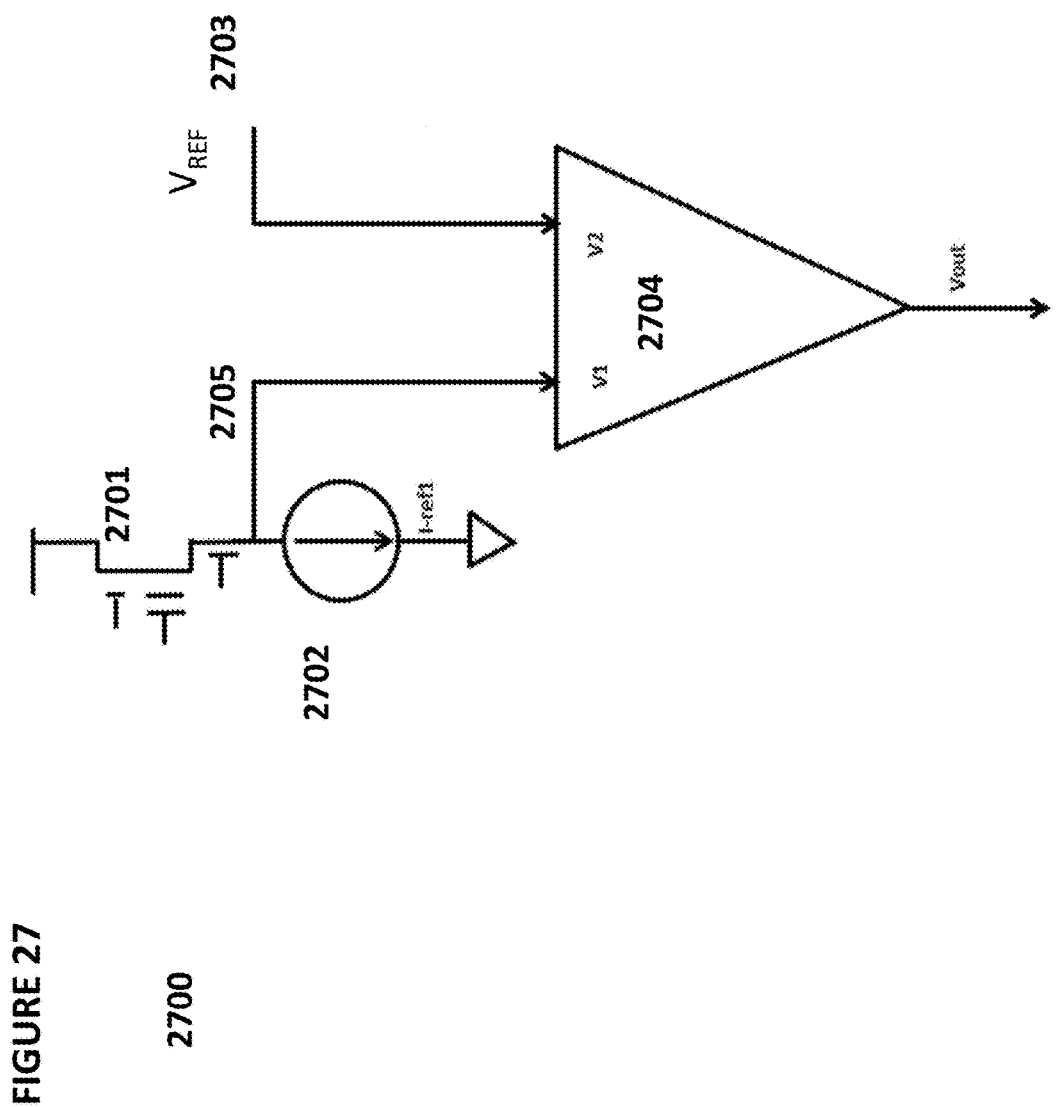
FIG. 27 depicts another embodiment of a data drift detector.

FIG. 27 depicts another embodiment of a data drift detector. Data drift detector 2700 comprises selected memory cell 2701, current source 2702, reference voltage 2703, and comparator 2704. In this embodiment, a direct comparison is made between a voltage stored on the floating gate of selected memory cell 2701 (voltage on node 2705=~VFG−VtFG) and reference voltage 2703 (which is the voltage that selected memory cell 2701 is intended to store). The memory cell 2701 is configured in a source-follower operation mode. The reference voltage can be generated from a reference memory cell.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A method of detecting data drift and refreshing data in a selected flash memory cell in an analog neuromorphic memory system, the method comprising:
   sensing a first voltage stored in a floating gate of the selected flash memory cell;
   comparing the first voltage with a second voltage provided by a reference circuit;
   if the first voltage exceeds the second voltage, refreshing the data stored in the floating gate by storing a third voltage on the floating gate, wherein the third voltage is closer to the second voltage than is the first voltage;
   wherein the refreshing is done by retransferring a training weight to the selected memory cell.

2. The method of claim 1, wherein the reference circuit comprises a voltage source.

3. The method of claim 1, wherein the reference circuit comprises a reference memory cell.

4. The method of claim 1, wherein the selected memory cell is a split gate memory cell.

5. The method of claim 1, wherein the selected memory cell is a stacked gate memory cell.

6. The method of claim 1, wherein the selected memory cell is configured in a source follower mode.

7. The method of claim 1, wherein the refreshing is done with a restored amount specifically for a current level.

8. A method of detecting data drift and refreshing data in a selected flash memory cell in an analog neuromorphic memory system, the method comprising:
   sensing a first current drawn by a selected flash memory cell during a read operation;
   comparing the first current with a second current drawn by a reference circuit;
   if the first current exceeds the second current, refreshing the data stored in a floating gate of the selected memory cell, such that the selected flash memory cell draws a third current during a read operation, wherein the third current is closer to the second current than is the first current; wherein the refreshing is done by retransferring a training weight to the selected memory cell.

9. The method of claim 8, wherein the reference circuit comprises a current source.

10. The method of claim 8, wherein the selected memory cell is a split gate memory cell.

11. The method of claim 8, wherein the selected memory cell is a stacked gate memory cell.

12. The method of claim 8, wherein the refreshing is done with a restored amount specifically for a current level.

13. A method of detecting data drift and refreshing data in a selected flash memory cell in an analog neuromorphic memory system, the method comprising:
   sampling a first current drawn by a selected flash memory cell during a read operation to generate a first sampled value;
   sampling a second current drawn by a reference circuit to generate a second sampled value;
   comparing the first sampled value and the second sampled value;
   if the first sampled value exceeds the second sampled value, refreshing the data stored in a floating gate of the selected memory cell, such that the selected flash memory cell draws a third current during a read operation, wherein the third current is closer to the second current than is the first current; wherein the refreshing is done by retransferring a training weight to the selected memory cell.

14. The method of claim 13, wherein the reference circuit comprises a current source.

15. The method of claim 13, wherein the selected memory cell is a split gate memory cell.

16. The method of claim 13, wherein the selected memory cell is a stacked gate memory cell.

17. The method of claim 13, wherein the refreshing is done with a restored amount specifically for a current level.

18. A method of detecting data drift and refreshing data in a selected flash memory cell in an analog neuromorphic memory system, the method comprising:
   sensing a first current drawn by a selected flash memory cell during a read operation;
   comparing the first current with a second current drawn by a reference circuit;
   comparing the first current with a third current drawn by another reference circuit;
   if the first current exceeds the third current, refreshing the data stored in a floating gate of the selected memory cell, such that the selected flash memory cell draws a current during a read operation, wherein the restored current is between the second and the third current; or
   if the first current exceeds the second current and does not exceed the third current, refraining from refreshing the data; wherein the refreshing is done by retransferring a training weight to the selected memory cell.

19. The method of claim 18, wherein the reference circuit comprises a current source.

20. The method of claim 18, wherein the selected memory cell is a split gate memory cell.

21. The method of claim 18, wherein the selected memory cell is a stacked gate memory cell.

22. The method of claim 18, wherein the refreshing is done with a restored amount specifically for current level.

* * * * *